US011049768B2

(12) United States Patent
Hopkins et al.

(10) Patent No.: US 11,049,768 B2
(45) Date of Patent: Jun. 29, 2021

(54) METHODS OF FORMING MICROELECTRONIC DEVICES, AND RELATED MICROELECTRONIC DEVICES, AND ELECTRONIC SYSTEMS

(71) Applicant: Micron Technology, Inc., Boise, ID (US)

(72) Inventors: John D. Hopkins, Meridian, ID (US); Jiewei Chen, Boise, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/667,733

(22) Filed: Oct. 29, 2019

(65) Prior Publication Data

US 2021/0125861 A1    Apr. 29, 2021

(51) Int. Cl.
| H01L 21/4763 | (2006.01) |
| H01L 21/768 | (2006.01) |
| H01L 27/11582 | (2017.01) |
| G11C 5/02 | (2006.01) |
| H01L 27/11556 | (2017.01) |

(52) U.S. Cl.
CPC ........ *H01L 21/76877* (2013.01); *G11C 5/025* (2013.01); *H01L 21/76802* (2013.01); *H01L 27/11556* (2013.01); *H01L 27/11582* (2013.01); *H01L 2225/06541* (2013.01)

(58) Field of Classification Search
CPC . H01L 25/50; H01L 2924/14; H01L 23/5226; H01L 23/49822; H01L 23/49827; H01L 23/53238; H01L 21/486; H01L 21/783; H01L 2225/06541; H01L 21/76877; H01L 21/76802; H01L 27/11556; H01L 27/11582; G11C 5/025
USPC .......................... 438/622, 637; 257/522, 758
See application file for complete search history.

(56) References Cited

U.S. PATENT DOCUMENTS 6,016,000 A * 1/2000 Moslehi .............. H01L 23/5222
257/522
7,553,756 B2 * 6/2009 Hayashi ............ H01L 21/76802
257/522

(Continued)

FOREIGN PATENT DOCUMENTS

| CN | 105280615 A | 1/2016 |
| CN | 105448925 A | 3/2016 |

(Continued)

*Primary Examiner* — Luan C Thai
(74) *Attorney, Agent, or Firm* — TraskBritt

(57) ABSTRACT

A method of forming a microelectronic device comprises forming a stack structure comprising insulative structures and additional insulative structures vertically alternating with the insulative structures. Apertures are formed to extend to surfaces of the insulative structures at different depths than one another within the stack structure. Dielectric liner structures are formed within the apertures. Sacrificial structures are formed within portions of the apertures remaining unoccupied by the dielectric liner structures. Upper portions of the sacrificial structures are replaced with capping structures. Portions of the insulative structures and remaining portions of the sacrificial structures are replaced with electrically conductive material. Microelectronic devices and electronic systems are also described.

19 Claims, 17 Drawing Sheets

(56) References Cited

U.S. PATENT DOCUMENTS

| | | | |
|---|---|---|---|
| 7,569,906 B2 * | 8/2009 | Mori | H01L 27/0629 257/416 |
| 8,320,181 B2 | 11/2012 | Violette | |
| 8,765,598 B2 | 7/2014 | Smith et al. | |
| 9,236,392 B1 | 1/2016 | Izumi et al. | |
| 9,716,104 B2 | 7/2017 | Kim et al. | |
| 10,141,330 B1 | 11/2018 | Lindsay et al. | |
| 2002/0195700 A1 * | 12/2002 | Li | H05K 1/0231 257/700 |
| 2004/0021222 A1 * | 2/2004 | Mori | H01L 27/11507 257/758 |
| 2005/0035456 A1 * | 2/2005 | Manning | H01L 21/76838 257/758 |
| 2009/0020744 A1 | 1/2009 | Mizukami et al. | |
| 2009/0121313 A1 * | 5/2009 | Hashimoto | H01L 21/7682 257/522 |
| 2019/0096906 A1 | 3/2019 | Lindsay et al. | |

FOREIGN PATENT DOCUMENTS

| KR | 10-2013-0007200 A | 1/2013 |
|---|---|---|
| KR | 10-2016-0094827 A | 8/2016 |

\* cited by examiner

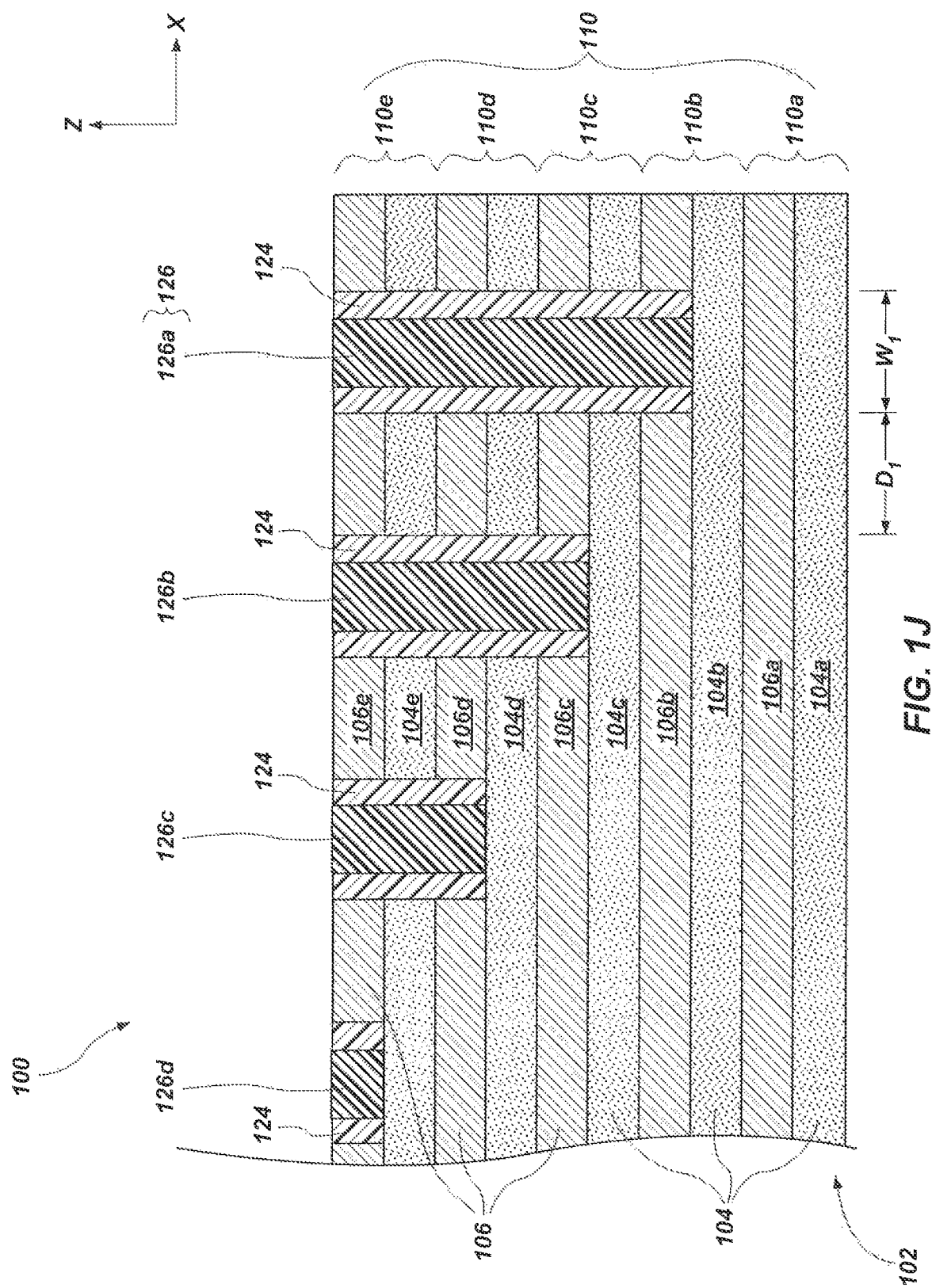

METHODS OF FORMING MICROELECTRONIC DEVICES, AND RELATED MICROELECTRONIC DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include additional tiers of conductive structures, and, hence, additional steps in the staircase structures associated therewith. However, increasing the number of steps of a staircase structure without undesirably increasing the overall width (e.g., horizontal footprint) of the staircase structure can decrease the acceptable margin of error associated with different acts in the process of forming the increased number of steps. A conventional process of forming a staircase structure may include repeated acts of trimming a uniform width of a mask (e.g., photoresist) overlying alternating conductive structures and insulating structures, etching portions of the insulating structures not covered by a remaining portion of the mask, and then etching portions of the conductive structures not covered by remaining portions of the insulating structures. Each of these repeated acts has an associated margin of error permitting the steps of the staircase structure to be suitably sized and positioned to form contact structures thereon. As the number of repeated acts increases, deviation from a desired step width and/or a desired step position may be compounded because errors in the size and/or position of one structure are transferred to subsequently formed structures later in the process. For a large number of steps in the staircase structure, margins of error to achieve suitably sized and positioned steps may be small, such as less than one percent (1%). Achieving such small margins of error can be very difficult using conventional methods, which may result in improperly positioned contact structures and may undesirably decrease yield (e.g., the number of memory cells that are validly programmable and erasable as a percentage of the total number of memory cells in a given batch). In addition, as feature packing densities have increased and margins for formation error have decreased, conventional configurations have resulted in undesirable defects (e.g., contact punch through) as well as current leaks and short circuits that can diminish desired memory device performance, reliability, and durability.

Accordingly, there remains a need for new microelectronic device (e.g., memory device, such as 3D NAND Flash memory device) configurations facilitating enhanced memory density while alleviating the problems of conventional microelectronic device configurations, as well as for new methods of forming the microelectronic devices and new electronic systems including the new microelectronic device configurations.

DETAILED DESCRIPTION

Figure 1A:
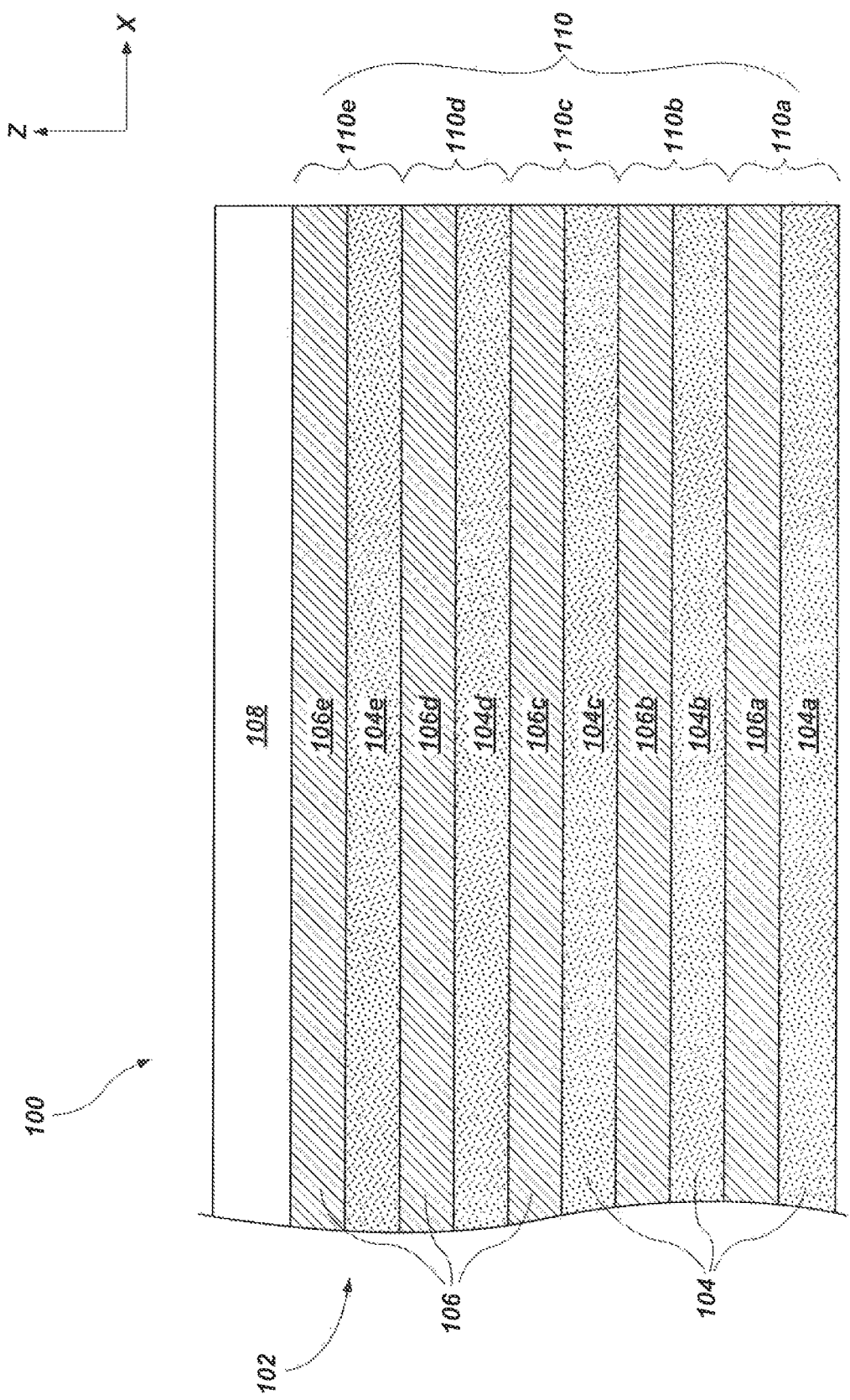
FIGS. 1A through 1O are partial cross-sectional views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIGS. 1A through 1O are simplified partial cross-sectional views illustrating embodiments of a method of forming a microelectronic device (e.g., a memory device, such as a 3D NAND Flash memory device). The microelectronic devices formed through the methods of the disclosure may include stack structures free of staircase structures (e.g., stair step structures), such as staircase structures included in many conventional microelectronic devices to facilitate electrical connections between conductive lines (e.g., access lines, word lines) and conductive structures of different tiers of stack structures of the conventional microelectronic devices. In addition, conductive structures of the stack structures of the disclosure may be formed to be integral and continuous with contact structures of the disclosure. With the description provided below, it will be readily apparent to one of ordinary skill in the art that the methods and structures described herein may be used in various devices.

Referring to FIG. 1A, a microelectronic device structure 100 may be formed to include a stack structure 102 and a mask structure 108 on or over the stack structure 102. The stack structure 102 includes a vertically alternating (e.g., in the Z-direction) sequence of insulative structures 104 and additional insulative structures 106 arranged in tiers 110.

Each of the tiers 110 of the stack structure 102 may include at least one of the insulative structures 104 vertically neighboring at least one of the additional insulative structures 106. The mask structure 108 may be formed on or over an upper surface of an uppermost tier 110 of the stack structure.

The stack structure 102 may include a desired quantity of the tiers 110. For clarity and ease of understanding of the drawings and related description, FIG. 1A shows the stack structure 102 including five (5) tiers 110 of the insulative structures 104 and the additional insulative structures 106. A first tier 110a includes a first insulative structure 104a and a first additional insulative structure 106a over the first insulative structure 104a; a second tier 110b overlies the first tier 110a, and includes a second insulative structure 104b and a second additional insulative structure 106b over the second insulative structure 104b; a third tier 110c overlies the second tier 110b, and includes a third insulative structure 104c and a third additional insulative structure 106c over the third insulative structure 104c; a fourth tier 110d overlies the third tier 110c, and includes a fourth insulative structure 104d and a fourth additional insulative structure 106d over the fourth insulative structure 104d; and a fifth tier 110e overlies the fourth tier 110d, and includes a fifth insulative structure 104e and a fifth additional insulative structure 106e over the fifth insulative structure 104e. However, the stack structure 102 may include a different quantity of tiers 110. For example, the stack structure 102 may include greater than or equal to ten (10) of the tiers 110, greater than or equal to twenty-five (25) of the tiers 110, greater than or equal to fifty (50) of the tiers 110, greater than or equal to one hundred (100) of the tiers 110, greater than or equal to one hundred and fifty (150) of the tiers 110, or greater than or equal to two hundred (200) of the tiers 110 of the insulative structures 104 and the additional insulative structures 106.

The insulative structures 104 of the tiers 110 of the stack structure 102 may be formed of and include at least one electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulative structures 104 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the insulative structures 104 are formed of and include a dielectric nitride material, such as $SiN_y$ (e.g., $Si_3N_4$). Each of the insulative structures 104 may individually include a substantially homogeneous distribution of the at least one electrically insulative material, or a substantially heterogeneous distribution of the at least one electrically insulative material. In some embodiments, each of the insulative structures 104 of each of the tiers 110 of the stack structure 102 exhibits a substantially homogeneous distribution of electrically insulative material. In additional embodiments, at least one of the insulative structures 104 of at least one of the tiers 110 of the stack structure 102 exhibits a substantially heterogeneous distribution of at least one electrically insulative material. The insulative structure 104 may, for example, be formed of and include a stack (e.g., laminate) of at least two different electrically insulative materials. The insulative structure 104 of each of the tiers 110 of the stack structure 102 be substantially planar, and may exhibit a desired thickness.

The additional insulative structures 106 of the tiers 110 of the stack structure 102 may be formed of and include at least one additional electrically insulative material. Material compositions of the additional insulative structures 106 and the insulative structures 104 may be selected such that the insulative structures 104 are selectively etchable relative to the additional insulative structures 106. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the additional insulative structures 106 is different than a material composition of the insulative structures 104, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the additional insulative structures 106 are formed of and include a dielectric oxide material, such as $SiO_x$ (e.g., Sift). Each of the additional insulative structures 106 may individually include a substantially homogeneous distribution of the at least one additional electrically insulative material, or a substantially heterogeneous distribution of the at least one additional electrically insulative material. In some embodiments, each of the additional insulative structures 106 of each of the tiers 110 of the stack structure 102 exhibits a substantially homogeneous distribution of additional electrically insulative material. In additional embodiments, at least one of the additional insulative structures 106 of at least one of the tiers 110 of the stack structure 102 exhibits a substantially heterogeneous distribution of at least one additional electrically insulative material. The additional insulating structure 106 may, for example, be formed of and include a stack (e.g., laminate) of at least two different additional electrically insulative materials. The additional insulative structure 106 of each of the tiers 110 of the stack structure 102 may be substantially planar, and may exhibit a desired thickness.

As shown in FIG. 1A, in some embodiments, the insulative structures 104 and the additional insulative structures 106 are arranged in a vertically alternating sequence beginning with one of the insulative structures 104. In additional embodiments, the insulative structures 104 and the additional insulative structures 106 exhibit a different arrangement relative to one another. By way of non-limiting example, the insulative structures 104 and the additional insulative structures 106 may be arranged in a vertically alternating sequence beginning with one of the additional insulative structures 106. Accordingly, each of the tiers 110 may include one of the insulative structures 104 on or over one of the additional insulative structures 106.

The mask structure 108 may be formed of and include at least one material (e.g., at least one hard mask material) suitable for use as an etch mask to pattern portions of the stack structure 102 (e.g., portions of the tiers 110, including portions of the insulative structures 104 and portions of the additional insulative structures 106) to form apertures (e.g., openings, vias, trenches) vertically extending (e.g., in the Z-direction) to the insulative structures 104 (e.g., the insulative structures 104a through 104e) of different tiers 110 (e.g., different tiers 110a through 110e) of the stack structure 102, as described in further detail below. By way of non-limiting example, the mask structure 108 may be formed of and include one or more hard mask materials having etch selectivity relative to the materials of the stack structure 102 (including the insulative structures 104 and the additional insulative structures 106). In some embodiments, the mask structure 108 comprises one or more of amorphous carbon and doped amorphous carbon (e.g., boron-doped amorphous carbon, such as boron-doped amorphous carbon comprising at least 1 weight percent (wt %) boron and at least 20 wt % carbon, such as between about 1 wt % boron and about 40 wt % boron, and between about 99 wt % carbon and about 60 wt % carbon). The mask structure 108 may be homogeneous (e.g., may include only one material layer), or may be heterogeneous (e.g., may include a stack exhibiting at least two different material layers). In addition, the mask structure 108 may exhibit any thickness permitting desired patterning of the stack structure 102 using mask structure 108, such as a thickness within a range of from about 1 nanometer (nm) to about 1000 nm.

The stack structure 102 (including the insulative structures 104 and the additional insulative structures 106 thereof) and the mask structure 108 may each individually be formed using conventional processes including, but not limited to, physical vapor deposition ("PVD"), chemical vapor deposition ("CVD"), atomic layer deposition ("ALD"), and/or spin-coating. PVD includes, but is not limited to, one or more of sputtering, evaporation, and ionized PVD. Such processes are known in the art and, therefore, are not described in detail herein.

Figure 1B:
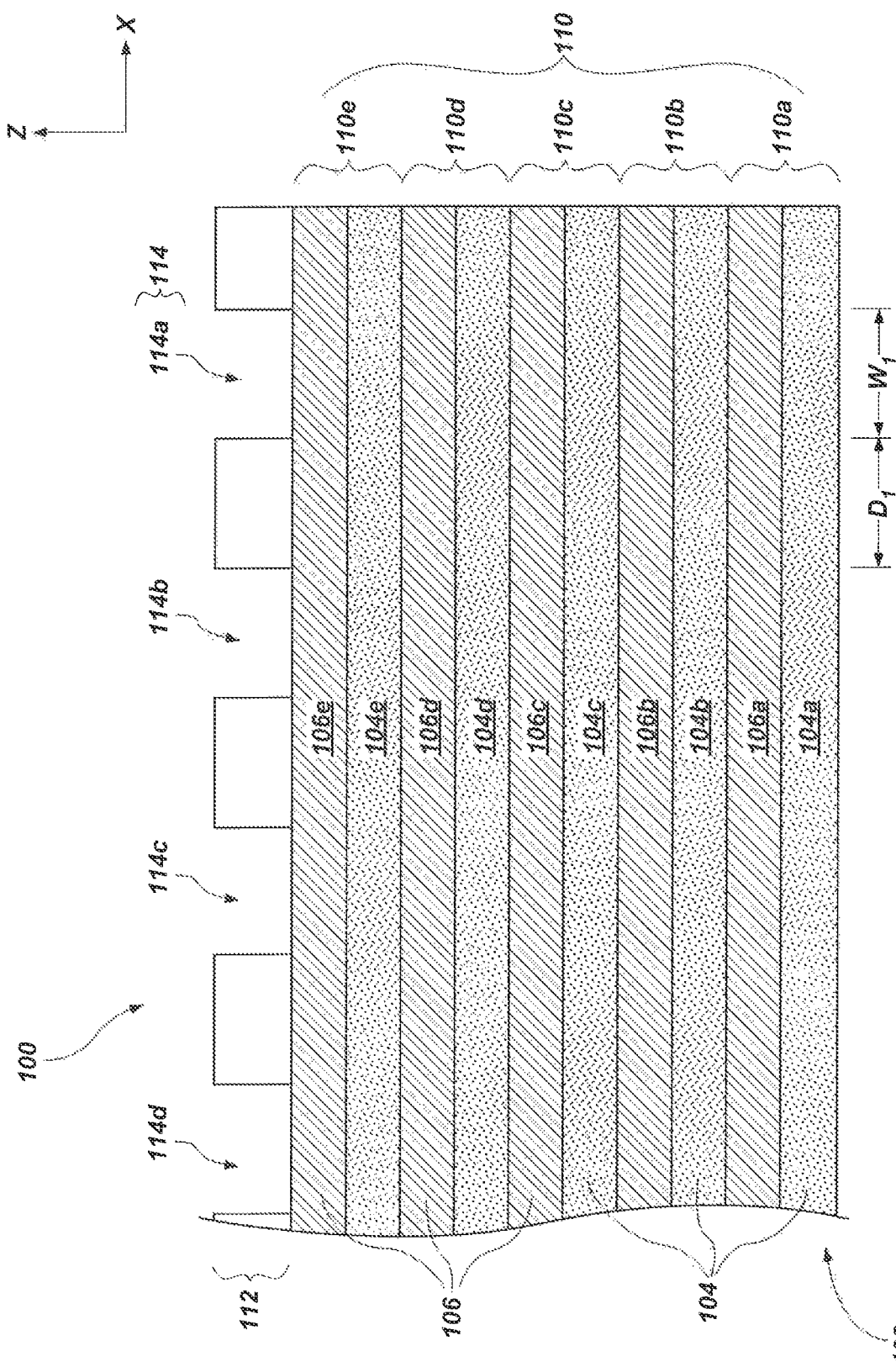

Referring next to FIG. 1B, portions of the mask structure 108 (FIG. 1A) are removed (e.g., etched) to form a patterned mask structure 112 including openings 114 (e.g., apertures, vias) vertically extending therethrough. As shown in FIG. 1B, the openings 114 may vertically extend (e.g., in the Z-direction) completely through the patterned mask structure 112, from an upper surface of the patterned mask structure 112 to an upper surface of the stack structure 102 (e.g., an upper surface of the fifth additional insulative structure 106e of the fifth tier 110e of the stack structure 102).

The patterned mask structure 112 may be formed to exhibit any desired quantity of the openings 114. The quantity of openings 114 included in the patterned mask structure 112 may be substantially the same as (e.g., equal to) or may be different than (e.g., less than, or greater than) the quantity of tiers 110 in the stack structure 102. In some embodiments, the quantity of openings 114 included in the patterned mask structure 112 is less than the quantity of tiers 110 in the stack structure 102. As a non-limiting example, as shown in FIG. 1B, if the stack structure 102 includes five (5) tiers 110 (e.g., the first tier 110a, the second tier 110b, the third tier 110c, the fourth tier 110d, and the fifth tier 110e), the patterned mask structure 112 may be formed to include less than or equal to four (4) openings 114 (e.g., a first opening 114a, a second opening 114b, a third opening 114c, a fourth opening 114d) therein. In additional embodiments, patterned mask structure 112 may include a different quantity of openings 114 (e.g., greater than four (4) openings 114, less than four (4) openings 114). As a non-limiting example, if the stack structure 102 includes five (5) tiers 110, the patterned mask structure 112 may be formed to include greater than or equal to five (5) openings 114 therein.

A geometric configuration (e.g., shape, dimensions), horizontal position (e.g., in the X-direction and in another horizontal direction orthogonal to the X-direction), and horizontal spacing of each of the openings 114 in the patterned mask structure 112 at least partially depend on the geometric configuration, horizontal position, and horizontal spacing of apertures to be formed in the stack structure 102 using the patterned mask structure 112, as described in further detail below. In turn, the geometric configuration, horizontal position, and horizontal spacing of each of the apertures to be formed in in the stack structure 102 may at least partially depend on geometric configurations, horizontal positions, and horizontal spacing of structures (e.g., dielectric structures, conductive structures) to be formed within each of the apertures in the stack structure 102, as also described in further detail below.

In some embodiments, the openings 114 exhibit substantially the same geometric configurations (e.g., substantially the same shapes and substantially the same dimensions) as one another, are regularly (e.g., uniformly, non-variably) horizontal spaced apart (e.g., horizontally separated, horizontally distanced) from one another, and are substantially horizontally aligned with one another. For example, each of the openings 114 may exhibit a substantially circular horizontal cross-sectional shape, may have substantially the same width Wi (e.g., diameter), may be horizontal spaced apart in the X-direction from each other of the openings 114 horizontally adjacent thereto by substantially the same distance Di, and may be substantially horizontally aligned in the Y-direction with each other of the openings 114. The width Wi of each of the openings 114 may, for example, be less than or equal to about 500 nm (e.g., less than or equal to about 400 nm, less than or equal to about 300 nm). In some embodiments, the width Wi of each of the openings 114 is about 300 nm. In addition, the distance Di between horizontally adjacent openings 114 may, for example, be less than or equal to about 1000 nm (e.g., less than or equal to about 800 nm, less than or equal to about 600 nm, less than or equal to about 500 nm, less than or equal to about 400 nm, less than or equal to about 300 nm). In some embodiments, the distance Di between horizontally adjacent openings 114 is about 300 nm. In additional embodiments, one or more of the openings 114 in the patterned mask structure 112 exhibits a different geometric configuration (e.g., a different shape, such as a non-circular horizontal cross-sectional shape; and/or different dimensions, such as a smaller width or a larger width) than one or more other of the openings 114, the openings 114 are non-regularly (e.g., non-uniformly, variably) horizontally spaced apart from one another, and/or one or more of the openings 114 is substantially horizontally unaligned with (e.g., horizontally offset from in a direction orthogonal to the X-direction) other of the openings 114. For example, one or more of the openings 114 may exhibit another width different than (e.g., larger than, smaller than) the width Wi. As another example, some horizontally neighboring openings 114 may be horizontally separated from one another by the distance Di, and other horizontally neighboring openings 114 may be horizontally separated from one another by another distance different than (e.g., less than, greater than) the distance Di.

The patterned mask structure 112, including the openings 114 therein, may be formed using conventional processes, such as conventional material removal processes (e.g., conventional photolithography processes; conventional etching processes, such as conventional dry etching processes) and conventional processing equipment, which are not described in detail herein. By way of non-limiting example, a dielectric anti-reflective coating (DARC) and a resist material (e.g., a photoresist material, such as a positive tone photoresist or a negative tone photoresist) may be sequentially formed over the mask structure 108 (FIG. 1A). Thereafter, the resist material may be patterned (e.g., photoexposed and developed), and then the pattern in the resist material may be transferred to the mask structure 108 (FIG. 1A) by way of at least one material removal process (e.g., at least one etching process) to form the patterned mask structure 112. Following the formation of the patterned mask structure 112, remaining portions of the DARC (if any) may be selectively removed, or may be temporarily maintained (e.g., to serve as a material removal stop structure).

Figure 1C:
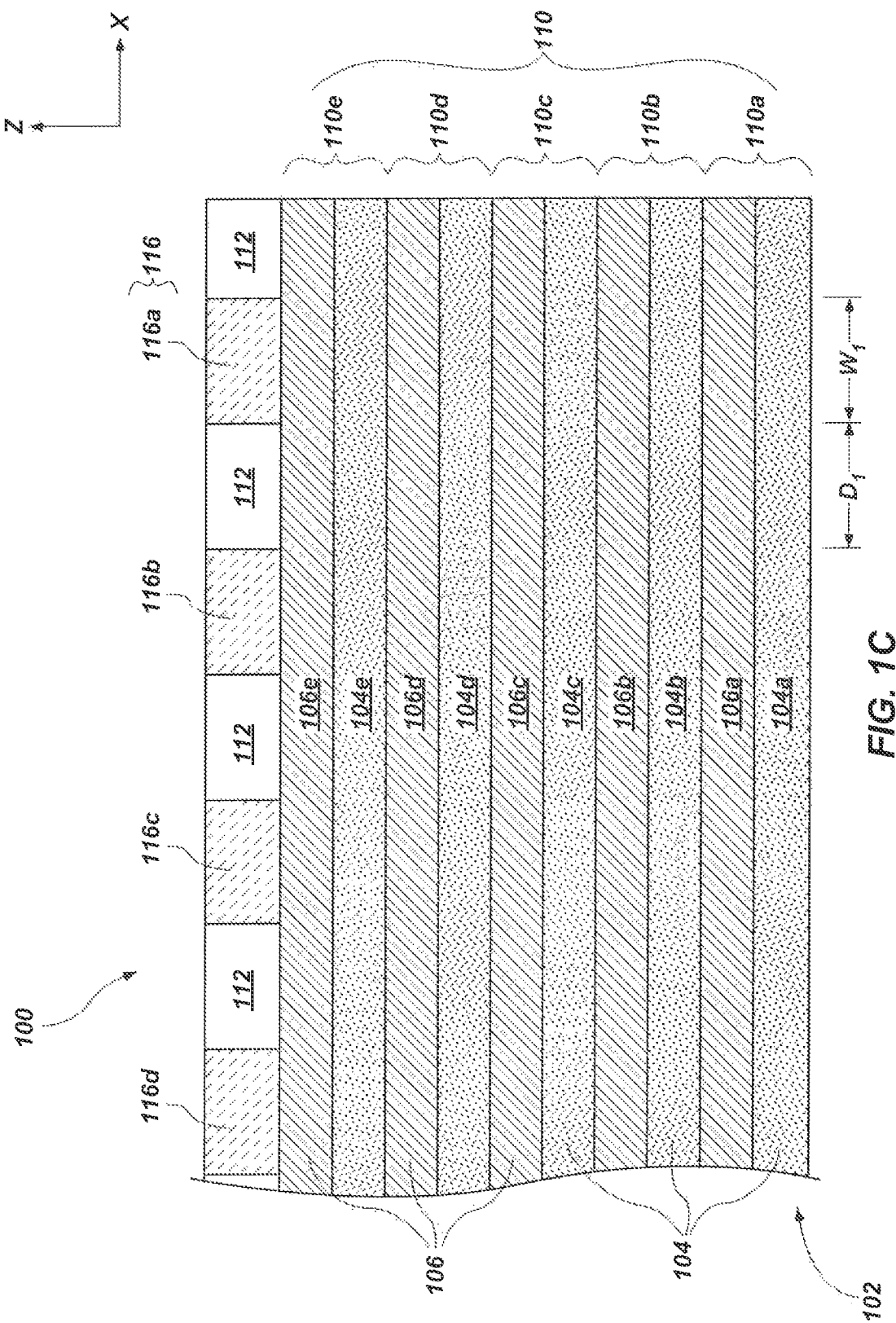

Referring next to FIG. 1C, sacrificial structures 116 are formed in the openings 114 (FIG. 2A) in the patterned mask structure 112. The sacrificial structures 116 may substantially fill each of the openings 114. For example, a first sacrificial structure 116a may be formed in and may substantially fill the first opening 114a (FIG. 1B), a second sacrificial structure 116b may be formed in and may substantially fill the second opening 114b (FIG. 1B), a third sacrificial structure 116c may be formed in and may substantially fill the third opening 114c (FIG. 1B), and a fourth sacrificial structure 116d may be formed in and may substantially fill the fourth opening 114d (FIG. 1B). As shown in FIG. 1C, the sacrificial structures 116 may be substantially confined (e.g., substantially horizontally confined, substantially vertically confined) within boundaries (e.g., horizontal boundaries, vertical boundaries) of the openings 114 (FIG. 2A) associated therewith. Accordingly, an upper surface of each of the sacrificial structures 116 may be substantially coplanar with an upper surface of the patterned mask structure 112. In additional embodiments, the sacrificial structures 116 may extend (e.g., horizontally extend, vertically extend) beyond the boundaries of the openings 114.

The sacrificial structures 116 may be formed of and include at least one material that is selectively etchable relative to the materials of the patterned mask structure 112 and the stack structure 102 (e.g., the insulative structures 104, the additional insulative structures 106). In some embodiments, the sacrificial structures 116 are selectively etchable relative to the insulative structures 104 and the additional insulative structures 106 of the stack structure 102. By way of non-limiting example, the sacrificial structures 116 may be formed of and include polysilicon. In additional embodiments, the etch selectivity of the sacrificial structures 116 is substantially similar to the etch selectivity of the additional insulative structures 106 of the stack structure 102, such that the sacrificial structures 116 and the additional insulative structures 106 are removed at substantially the same rate by a given etchant. The material of the sacrificial structures 116 may be the same as or may different than the electrically insulative material of the additional insulative structures 106 of the stack structure 102. By way of non-limiting example, if the additional insulative structures 106 are formed of a dielectric oxide material (e.g., $SiO_x$, such as $SiO_2$), the sacrificial structures 116 may also be formed of a dielectric oxide material (e.g., $SiO_x$, such as $SiO_2$).

Figure 1D:
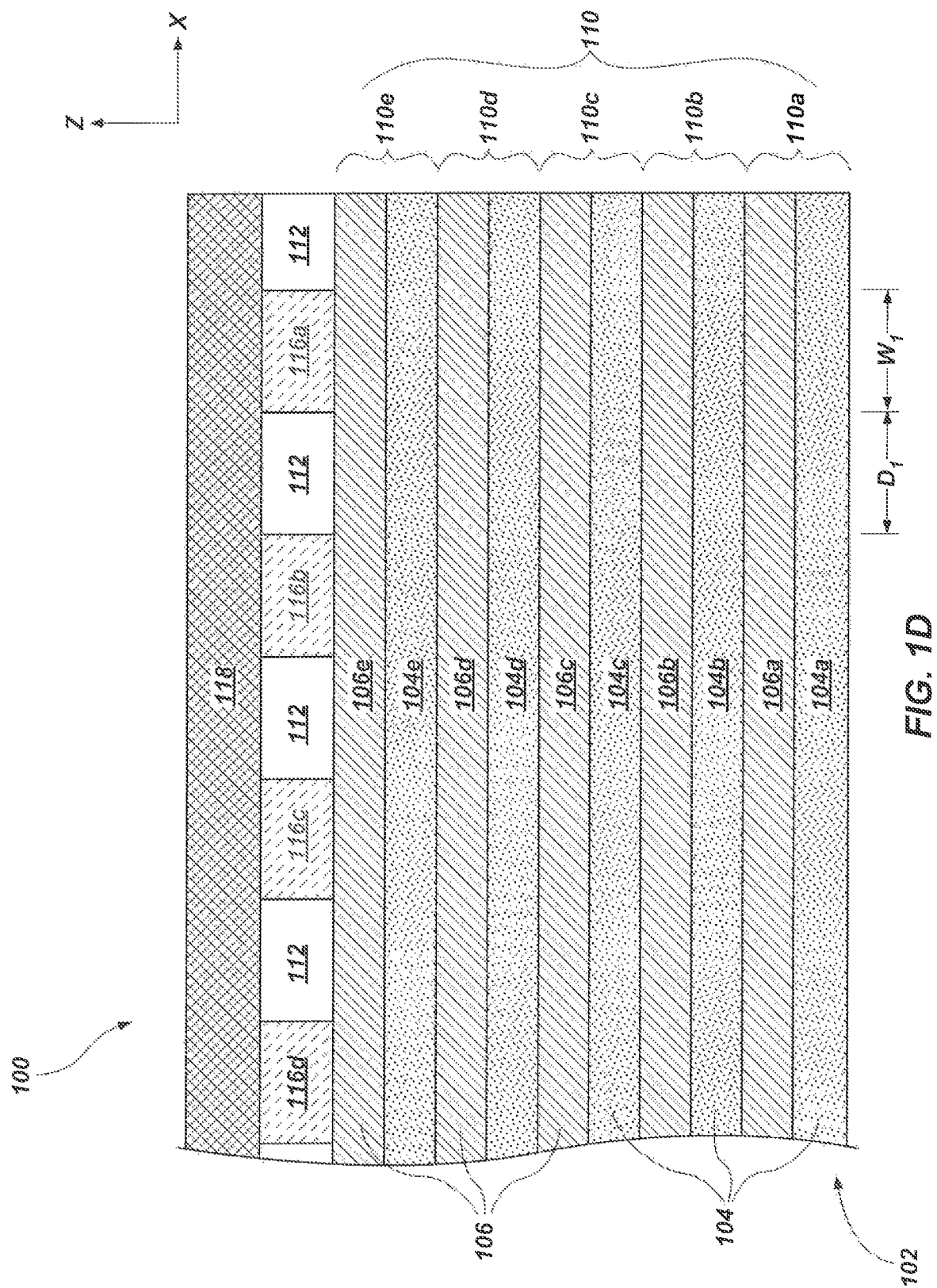

Referring next to FIG. 1D, a photoresist structure 118 is formed on or over the patterned mask structure 112 and the sacrificial structures 116. The photoresist structure 118 may serve as a mask to facilitate selective removal of one or more of the sacrificial structures 116 and portions of the tiers 110 of the insulative structures 104 and the additional insulative structures 106, as described in further detail below. The photoresist structure 118 may be formed of and include a conventional photoresist material, such as a conventional positive tone photoresist material, or a conventional negative tone photoresist material. If the photoresist structure 118 comprises a positive tone photoresist material, the photoresist structure 118 may be formulated such that regions thereof exposed to at least a minimum threshold dosage of electromagnetic radiation and, optionally, a post-exposure bake become at least partially soluble in a suitable developer (e.g., a positive tone developer). Photoexposed regions (e.g., regions exposed to the minimum threshold dosage of electromagnetic radiation) of the photoresist structure 118 may be at least partially (e.g., substantially) removed by the developer while non-photoexposed regions (e.g., regions not exposed to the minimum threshold dosage of electromagnetic radiation) may remain substantially intact (e.g., not substantially removed), as described in further detail below. Alternatively, if the photoresist structure 118 comprises a negative tone photoresist material, the photoresist structure 118 may be formulated such that regions thereof not exposed to at least a minimum threshold dosage of electromagnetic radiation are at least partially soluble in a suitable developer (e.g., a negative tone developer). Non-photoexposed regions of the photoresist structure 118 may be at least partially (e.g., substantially) removed by the developer while photoexposed regions may remain substantially intact (e.g., not substantially removed), as also described in further detail below. The properties (e.g., tone) of the photoresist structure 118 may be selected relative to material compositions of the materials (e.g., the sacrificial structures 116, the additional insulative structures 106, the insulative structures 104) underlying the photoresist structure 118 to facilitate desired patterning of the materials, as described in further detail below. Suitable photoresist materials (e.g., positive tone photoresist materials, negative tone photoresist materials) are known in the art, and are, therefore, not described in detail herein. The photoresist structure 118 may, for example, be compatible with 13.7 nm, 157 nm, 193 nm, 248 nm, or 365 nm wavelength systems; with 193 nm wavelength immersion systems; and/or with electron beam lithographic systems. In addition, the photoresist structure 118 may exhibit any thickness permitting desired patterning of the stack structure 102 using photoresist structure 118, such as a thickness within a range of from about 1 nm to about 10,000 nm (e.g., about 10,000 nm).

The photoresist structure 118 may be formed using conventional processes including, but not limited to, PVD, CVD, ALD, and/or spin-coating. Such processes are known in the art and, therefore, are not described in detail herein.

Figure 1E:
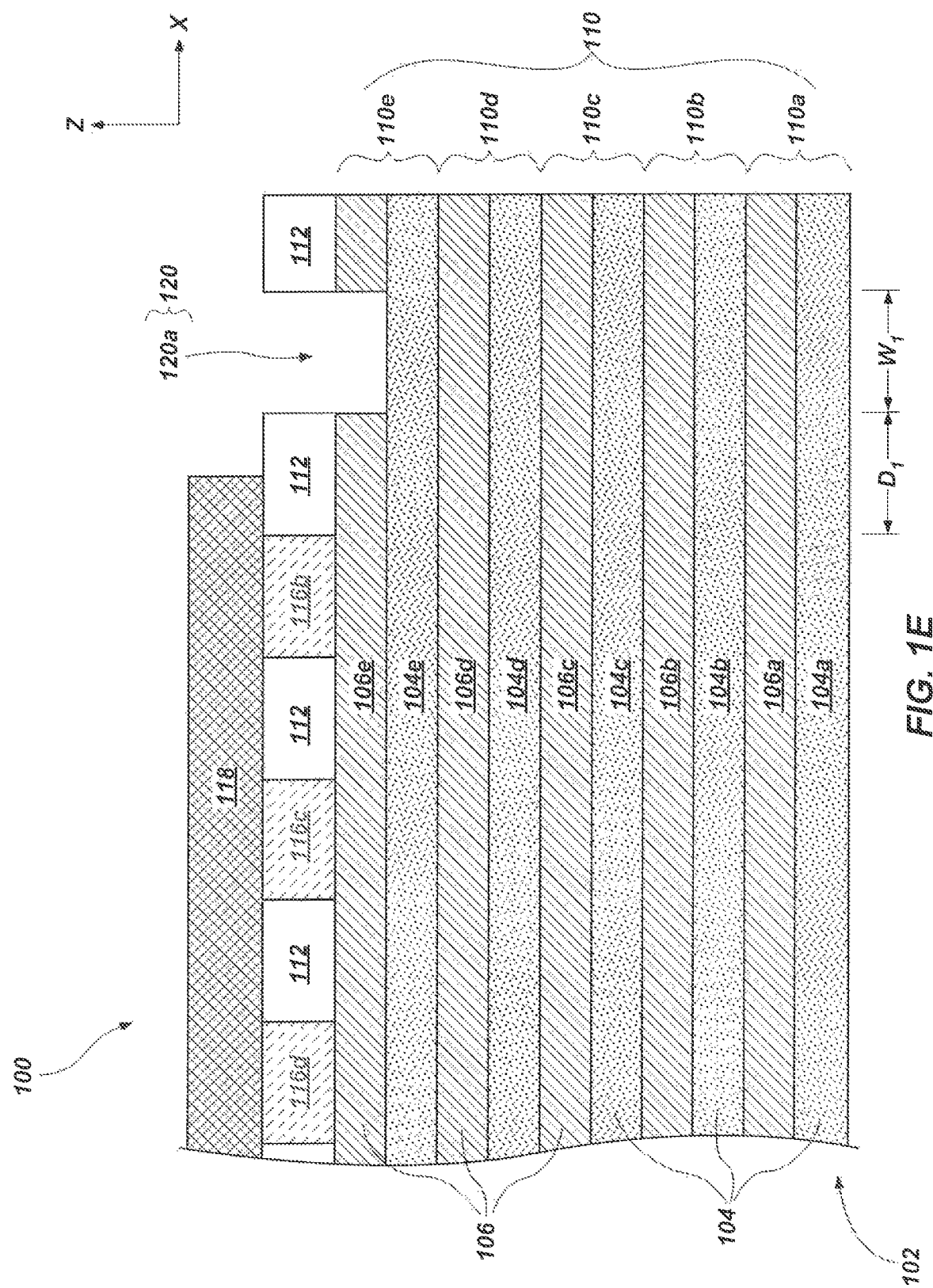

Referring next to FIG. 1E, the microelectronic device structure 100 is subjected to a first material removal process to remove (e.g., trim) a width of the photoresist structure 118 to expose (e.g., uncover) at least one of the sacrificial structures 116 (FIG. 1D), and then remove the at least one of the sacrificial structures 116 and portions of at least one of the tiers 110 of the stack structure 102 thereunder to form one or more apertures 120 vertically extending into the stack structure 102. By way of non-limiting example, as shown in FIG. 1E, the photoresist structure 118 may be trimmed back to a location horizontally intermediate (e.g., horizontally between) the first sacrificial structure 116a (FIG. 1C) and the second sacrificial structure 116b, and then the first sacrificial structure 116a and a portion of the fifth additional insulative structure 106e of the fifth tier 110e of the stack structure 102 may be selectively removed to form a first aperture 120a vertically extending into the stack structure 102. The first aperture 120a may terminate (e.g., end, stop) at an upper surface of the fifth insulative structure 104e of the fifth tier 110e of the stack structure 102.

The first material removal process may trim any amount of the photoresist structure 118 sufficient to substantially expose at least one of the sacrificial structures 116 (FIG. 1D). As shown in FIG. 1E, in some embodiments, the photoresist structure 118 is trimmed to a location about midway (e.g., equidistant) between horizontally neighboring sacrificial structures 116 (e.g., about midway between the first sacrificial structure 116a (FIG. 1D) and the second sacrificial structure 116b) to substantially expose one of the horizontally neighboring sacrificial structures 116 (e.g., the first sacrificial structure 116a (FIG. 1D)) while keeping the other of the horizontally neighboring sacrificial structures 116 (e.g., the second sacrificial structure 116b) substantially covered by a remaining portion of the photoresist structure 118. In additional embodiments, the photoresist structure 118 may be trimmed to a location more horizontally proximate to one of the horizontally neighboring sacrificial structures 116 than the other of the horizontally neighboring sacrificial structures 116 (e.g., more horizontally proximate to the first sacrificial structure 116a (FIG. 1D), or more horizontally proximate to the second sacrificial structure 116b).

The first material removal process may include photolithographically processing the photoresist structure 118 to remove the width of the photoresist structure 118, and then removing one or more sacrificial structures 116 (FIG. 1D) (e.g., the first sacrificial structure 116a (FIG. 1D)) not covered by a remaining portion of the photoresist structure 118 as well as a portion of one or more of the tiers 110 of the stack structure 102 thereunder using at least one etching process. For example, the photoresist structure 118 may be exposed to an appropriate wavelength (e.g., 13.7 nm, 157 nm, 193 nm, 248 nm, 365 nm) of radiation through a reticle and then developed to trim the width of the photoresist structure 118 and expose (e.g., uncover) the first sacrificial structure 116a (FIG. 1D), and then the first sacrificial structure 116a and a portion of the fifth additional insulative structure 106e of the fifth tier 110e of the stack structure 102 may be selectively removed using at least one etching process (e.g., at least one anisotropic etching process, such as an anisotropic dry etching process) to expose a portion of the fifth insulative structure 104e of the fifth tier 110e of the stack structure 102. In some embodiments, such as in embodiments wherein the etch selectivity of material (e.g., polysilicon) of the sacrificial structures 116 (FIG. 1D) is different than the etch selectivity of material (e.g., dielectric oxide material) of the fifth additional insulative structure 106e, a first etching process is used to remove the first sacrificial structure 116a, and then a second etching process is used to remove the portion of the fifth additional insulative structure 106e thereunder. In additional embodiments, such as in embodiments wherein the etch selectivity of material (e.g., dielectric oxide material) of the sacrificial structures 116 is substantially similar to the etch selectivity of material (e.g., dielectric oxide material) of the fifth additional insulative structure 106e, a single (e.g., only one) etching process is used to remove the first sacrificial structure 116a and the portion of the fifth additional insulative structure 106e thereunder. Process parameters (e.g., radiation wavelengths, developers, etchants, exposure times) of the first material removal process may be tailored to the configurations (e.g., material compositions, material distributions, thicknesses, arrangements) of the photoresist structure 118, the patterned mask structure 112, and the stack structure 102 (including the configurations of the insulative structures 104 and the additional insulative structures 106 thereof).

Figure 1F:
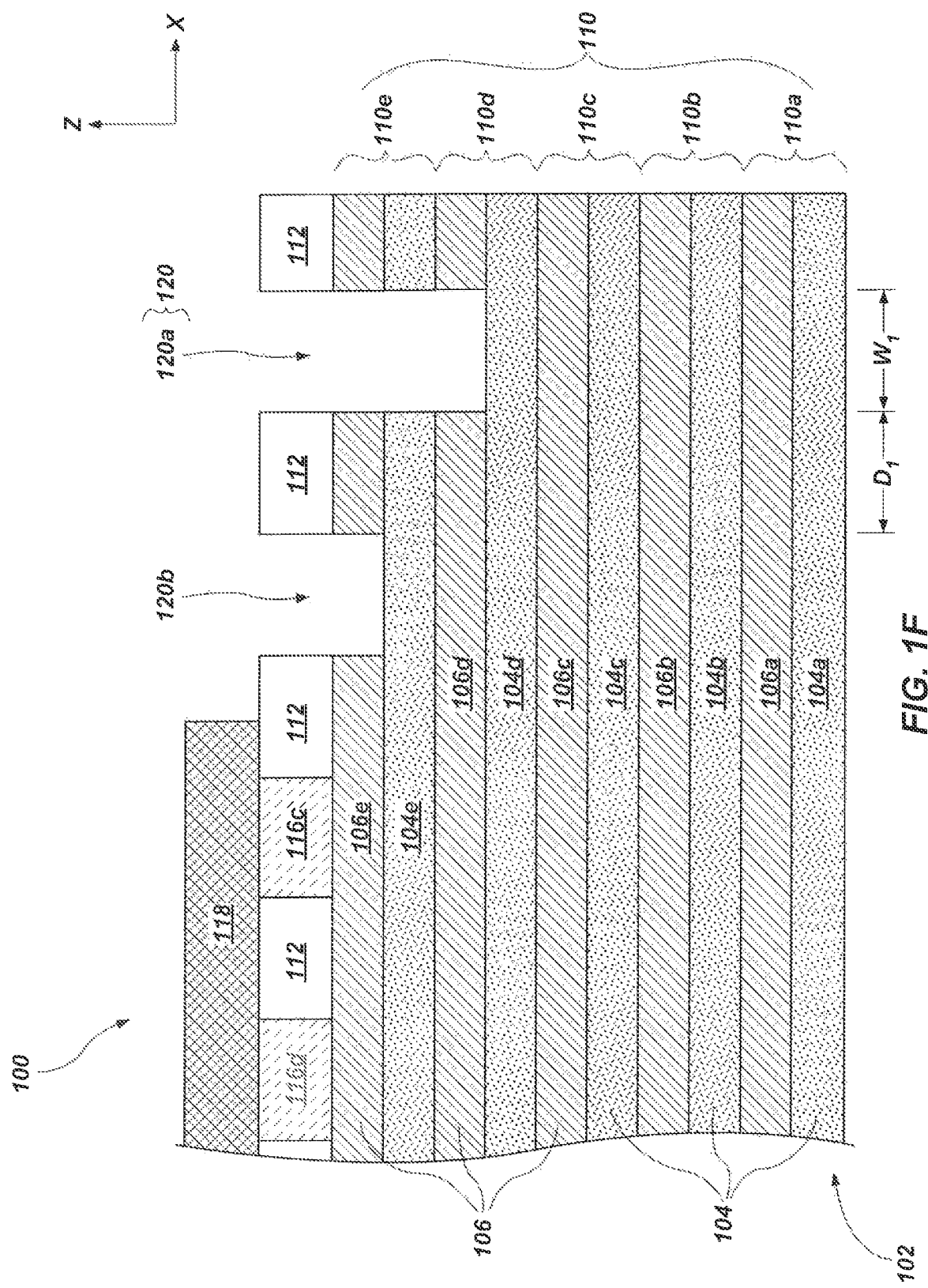

Referring next to FIG. 1F, the microelectronic device structure 100 may be subjected to a second material removal process to remove (e.g., trim) another width of the photoresist structure 118 to expose (e.g., uncover) at least one other of the sacrificial structures 116 (FIG. 1D), remove the at least one other of the sacrificial structures 116, and remove portions of at least two of the tiers 110 of the stack structure 102 to increase the number of apertures 120 vertically extending into the stack structure 102 and increase the depth(s) of the apertures 120 previously formed in the stack structure 102 (e.g., through the first material removal process). By way of non-limiting example, as shown in FIG. 1F, the photoresist structure 118 may be trimmed back to a location horizontally intermediate (e.g., horizontally between) the second sacrificial structure 116b (FIG. 1E) and the third sacrificial structure 116c; portions of the fifth insulative structure 104e of the fifth tier 110e of the stack structure 102 and of the fourth additional insulative structure 106d of the fourth tier 110d of the stack structure 102 underlying the first aperture 120a may be selectively removed to increase the depth of the first aperture 120a; and the second sacrificial structure 116b and a portion of the fifth additional insulative structure 106e of the fifth tier 110e underlying the second sacrificial structure 116b may be selectively removed to form a second aperture 120b vertically extending into the stack structure 102. The first aperture 120a, as vertically extended during the second material removal process, may terminate at an upper surface of the fourth insulative structure 104d of the fourth tier 110d of the stack structure 102. The second aperture 120b, as formed during the second material removal process, may terminate at an upper surface of the fifth insulative structure 104e of the fifth tier 110e of the stack structure 102.

The second material removal process may trim any amount of the photoresist structure 118 remaining following the first material removal process sufficient to substantially expose at least one of the sacrificial structures 116 (FIG. 1D) remaining after the first material removal process. As shown in FIG. 1F, in some embodiments, the photoresist structure 118 is trimmed to a location about midway (e.g., equidistant) between remaining horizontally neighboring sacrificial structures 116 (e.g., about midway between the second sacrificial structure 116b (FIG. 1E) and the third sacrificial structure 116c) to substantially expose one of the remaining horizontally neighboring sacrificial structures 116 (e.g., the second sacrificial structure 116b (FIG. 1E)) while keeping the other of the remaining horizontally neighboring sacrificial structures 116 (e.g., the third sacrificial structure 116c) substantially covered by a further remaining portion of the photoresist structure 118. In additional embodiments, the photoresist structure 118 may be trimmed to a location more horizontally proximate to one of the remaining horizontally neighboring sacrificial structures 116 than the other of the horizontally neighboring sacrificial structures 116 (e.g., more horizontally proximate to the second sacrificial structure 116b (FIG. 1E), or more horizontally proximate to the third sacrificial structure 116c).

The second material removal process may include photolithographically processing the photoresist structure 118 remaining following the first material removal process to remove an additional width of the photoresist structure 118; removing exposed portions of one or more of the insulative structures 104 using an etching process; and removing exposed sacrificial structures 116, and portions of the additional insulative structures 106 uncovered following the removal of the exposed sacrificial structures 116 and the exposed portions of the insulative structures 104 using another etching process. For example, the photoresist structure 118 may be exposed to an appropriate wavelength of radiation through a reticle and then developed to trim the additional width from the photoresist structure 118 and expose the second sacrificial structure 116b (FIG. 1E); a portion of the fifth insulative structure 104e of the fifth tier 110e of the stack structure 102 may be selectively removed using at least one etching process (e.g., at least one anisotropic etching process, such as an anisotropic dry etching process) to expose a portion of the fourth additional insulative structure 106d of the fourth tier 110d of the stack structure 102; and the second sacrificial structure 116b, a portion of the fifth additional insulative structure 106e of the fifth tier 110e of the stack structure 102 underlying the second sacrificial structure 116b, and the exposed portion of the fourth additional insulative structure 106d may be selectively removed using at least one other etching process (e.g., at least one other anisotropic etching process, such as another anisotropic dry etching process) to expose another portion of the fifth insulative structure 104e and a portion of the fourth insulative structure 104d. The portion of the fifth insulative structure 104e may be removed before or after the removal of the additional width of the photoresist structure 118, and may be removed prior to removing the second sacrificial structure 116b and the portions of the fifth additional insulative structure 106e and the fourth additional insulative structure 106d. In addition, a single (e.g., only one) etching process may be used to remove the second sacrificial structure 116b and the portions of the fifth additional insulative structure 106e and the fourth additional insulative structure 106d, or a first etching process may be used to remove the second sacrificial structure 116b and then a second etching process may be used to remove the portions of the fifth additional insulative structure 106e and the fourth additional insulative structure 106d. The portions of the fifth additional insulative structure 106e and the fourth additional insulative structure 106d may be removed substantially simultaneously. Process parameters (e.g., radiation wavelengths, developers, etchants, exposure times) of the second material removal process may be tailored to the configurations (e.g., material compositions, material distributions, thicknesses, arrangements) of the photoresist structure 118, the patterned mask structure 112, and the stack structure 102 (including the configurations of the insulative structures 104 and the additional insulative structures 106 thereof).

Figure 1G:
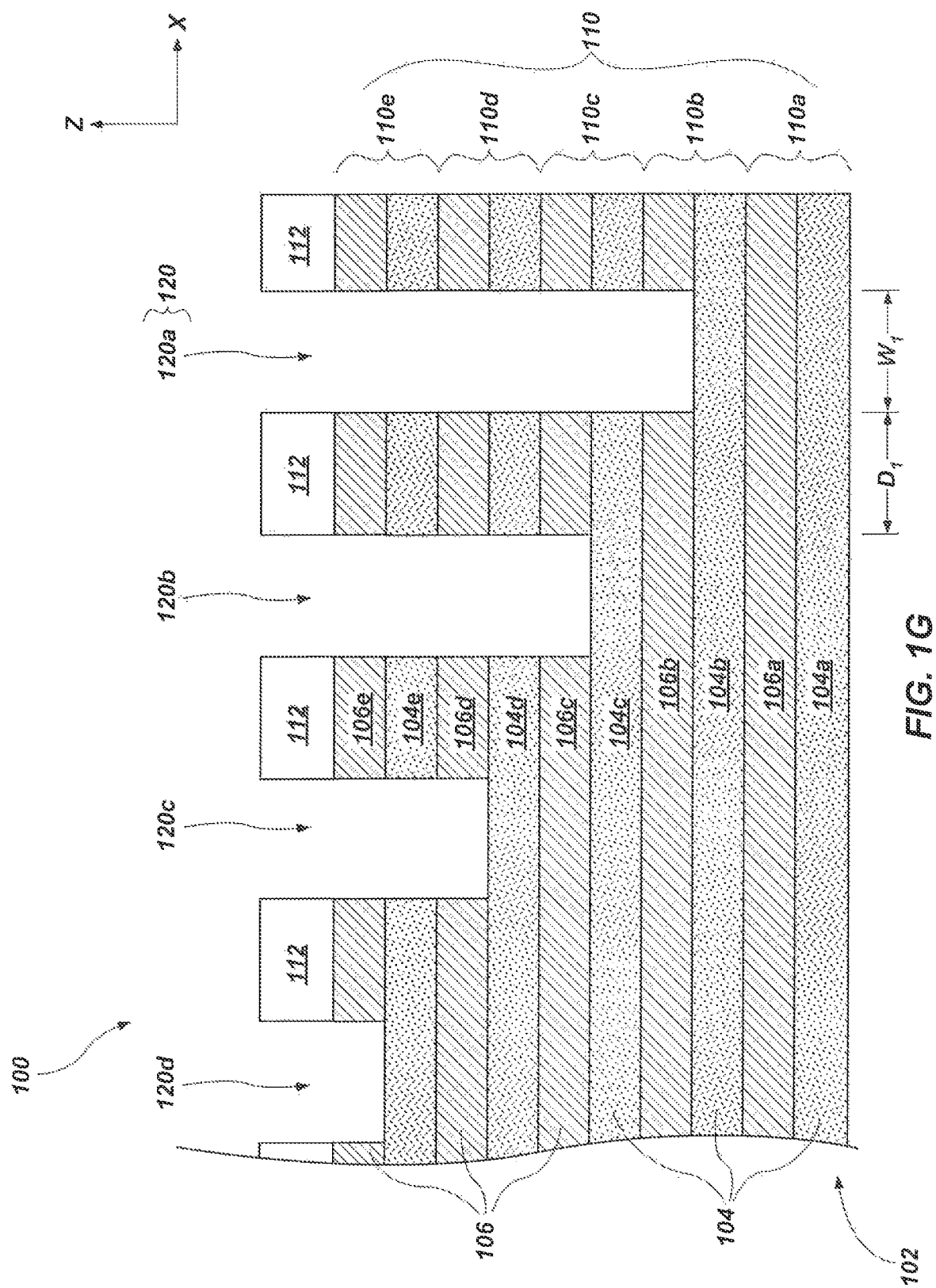

Referring next to FIG. 1G, the microelectronic device structure 100 may be subjected to additional material removal processes to remove (e.g., trim) additional portions of the photoresist structure 118, the additional insulative structures 106, and the insulative structures 104 to further increase the number of apertures 120 vertically extending into the stack structure 102 and to further increase the depth of apertures 120 previously formed in the stack structure 102 (e.g., through the first material removal process and the second material removal process). For example, as shown in FIG. 1G, the additional material removal processes may increase the depths of the first aperture 120a and the second aperture 120b within the stack structure 102, and may also form a third aperture 120c and a fourth aperture 120d within the stack structure 102. The apertures 120 may extend to different depths within the stack structure 102 than one another. The apertures 120 may, for example, vertically extend to different insulative structures 104 of the stack structure 102 than one another. By way of non-limiting example, following the additional material removal processes, the first aperture 120a may vertically extend to an upper surface of the second insulative structure 104b of the second tier 110b of the stack structure 102, the second aperture 120b may vertically extend to an upper surface of the third insulative structure 104c of the third tier 110c of the stack structure 102, the third aperture 120c may vertically extend to an upper surface of the fourth insulative structure 104d of the fourth tier 110d of the stack structure 102, and the fourth aperture 120d may vertically extend to an upper surface of the fifth insulative structure 104e of the fifth tier 110e of the stack structure 102.

While various embodiments herein are described and illustrated for clarity in the context of the microelectronic device structure 100 as being formed to include four (4) apertures 120 vertically extending to different depths within the stack structure 102, the microelectronic device structure 100 may, alternatively, be formed to include a different quantity (e.g., number, amount) of apertures 120 and/or one or more of the apertures 120 may vertically extend to different depths than those depicted in FIG. 1G. In some embodiments, the quantity of apertures 120 formed equals (e.g., is the same as) the quantity of insulative structures 104 included in the stack structure 102. By way of non-limiting example, if the stack structure 102 is formed to include fifty (50) of the insulative structures 104, fifty (50) apertures 120 may be formed in the microelectronic device structure 100. In additional embodiments, the quantity of apertures 120 formed may be different than (e.g., less than, greater than) the number of insulative structures 104 included in the stack structure 102. By way of non-limiting example, if the stack structure 102 is formed to include fifty (50) insulative structures 104, less than fifty (50) apertures 120 (e.g., less than or equal to forty-nine (49) apertures 120) may be formed in the microelectronic device structure 100, or greater than fifty (50) apertures 120 (e.g., greater than or equal to fifty-one (51) apertures 120) may be formed in the microelectronic device structure 100. Each of the apertures 120 may vertically extend to a different one of the insulative structures 104 of the stack structure 102 than each other of the apertures 120, or at least some (e.g., two or more) of the apertures 120 may vertically extend to one or more of the same insulative structures 104 of the stack structure 102.

The additional material removal processes may include photolithographically processing the photoresist structure 118 remaining following previous material removal processes (e.g., the first material removal process, the second material removal process) to remove an additional width of the photoresist structure 118; removing exposed portions of the insulative structures 104 using one or more etching processes (e.g., one or more anisotropic etching processes, such as one or more anisotropic dry etching processes); and removing exposed sacrificial structures 116, and portions of the additional insulative structures 106 uncovered following the removal of the exposed sacrificial structures 116 and the exposed portions of the insulative structures 104 using one or more other etching processes (e.g., one or more other anisotropic etching processes, such as one or more other anisotropic dry etching processes). Process parameters (e.g., radiation wavelengths, developers, etchants, exposure times) of the additional material removal processes may be tailored to the configurations (e.g., material compositions, material distributions, thicknesses, arrangements) of the photoresist structure 118, the patterned mask structure 112, and the stack structure 102 (including the configurations of the insulative structures 104 and the additional insulative structures 106 thereof). Duration(s) and/or end-point scheme(s) for one or more of the additional material removal processes may be substantially the same as or may be different than duration(s) and/or end-point scheme(s) for one or more of the first material removal process, the second material removal process, and one or more other of the additional material removal processes.

Figure 1H:
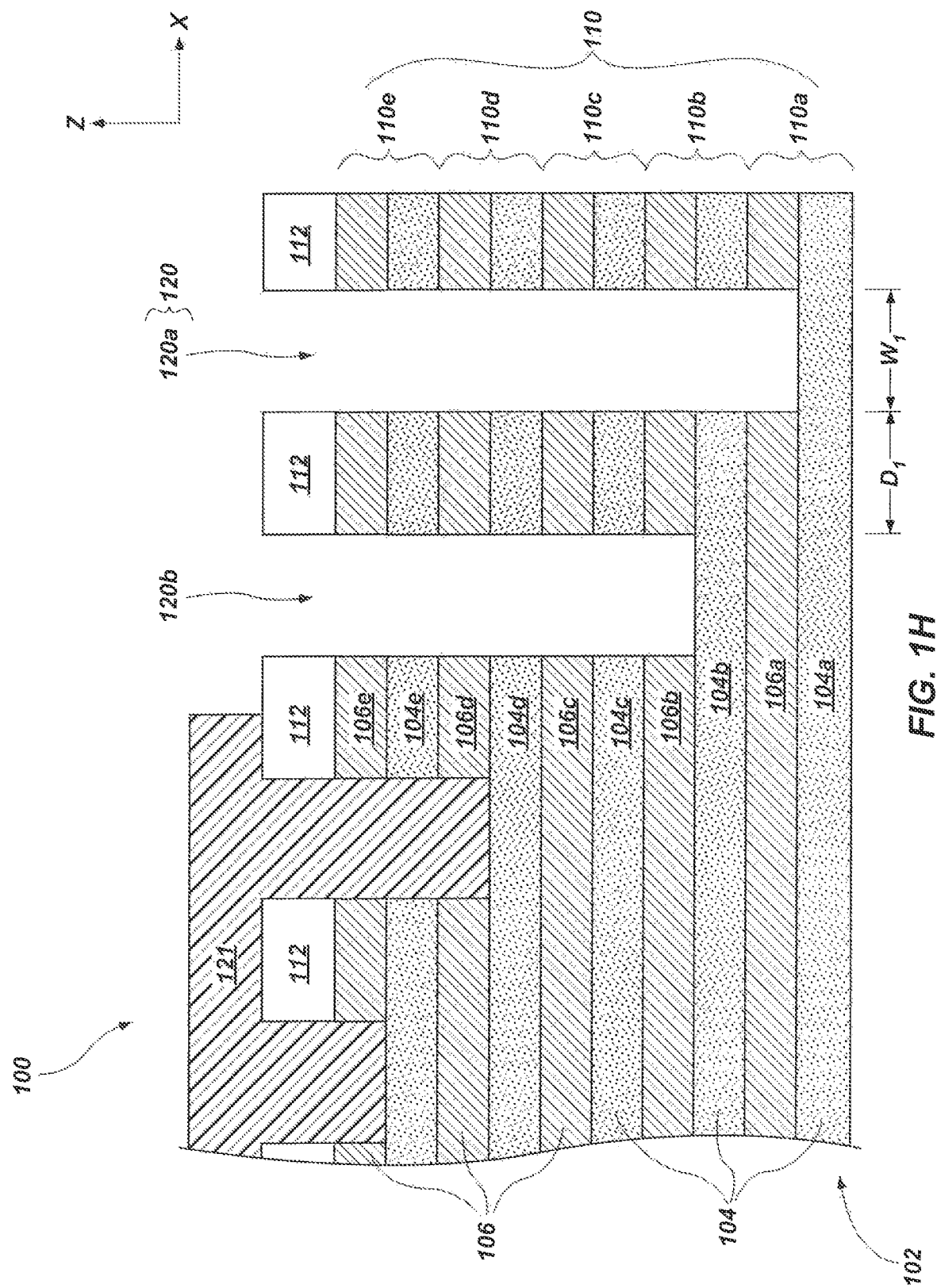

Referring next to FIG. 1H, optionally, one or more of the apertures 120 may be at least partially (e.g., substantially) filled with a masking material 121, and then the microelectronic device structure 100 may be subjected to one or more other material removal processes (e.g., one or more chopping processes) to increase the depth(s) of one or more other of the apertures 120 remaining unfilled with the masking material 121. For example, the masking material 121 may be disposed within the third aperture 120c (FIG. 1G) and the fourth aperture 120d (FIG. 1G), and then the vertical depths of the first aperture 120a and the second aperture 120b may be increased using at least one additional material removal process. As shown in FIG. 1H, the first aperture 120a may be vertically extended to terminate at an upper surface of the first insulative structure 104a of the first tier 110a of the stack structure 102, and the second aperture 120b may be vertically extended to terminate at an upper surface of the second insulative structure 104b of the second tier 110b of the stack structure 102. The masking material 121 may substantially protect portions of the stack structure 102 underlying the third aperture 120c and the fourth aperture 120d from being removed during the one or more other material removal processes.

The masking material 121, if any, may be formed of and include a material facilitating the selective removal of portions of the stack structure 102 (e.g., portions of the tiers 110 of the insulative structures 104 and the additional insulative structures 106) underlying apertures 120 (e.g., the first aperture 120a, the second aperture 120b) remaining substantially free of (e.g., substantially unfilled with) the masking material 121. By way of non-limiting example, the masking material 121 may be formed of and include a conventional photoresist material, such as a conventional positive tone photoresist material, or a conventional negative tone photoresist material. Suitable photoresist materials (e.g., positive tone photoresist materials, negative tone photoresist materials) are known in the art, and are, therefore, not described in detail herein.

The masking material 121, if any, may be formed to fill any desired quantity of the apertures 120 less than the total number of the apertures 120. Which apertures 120 are filled with the masking material 121 (and, hence, which apertures 120 are vertically extended by the other material removal processes) may be selected based on desired configurations of structures (e.g., liner structures, contact structures) to be subsequently formed within the apertures 120, as described in further detail below. While various embodiments herein are described and illustrated for clarity in the context of the masking material 121 as being formed to fill two (2) of the apertures 120, the masking material 121 may, alternatively, be formed to fill a different number of apertures 120, such as greater than two (2) of the apertures 120 or less than two (2) of the apertures 120. As shown in FIG. 1H, in some embodiments, the masking material 121 is formed on or over surfaces (e.g., surfaces of the stack structure 102, surfaces of the patterned mask structure 112) within the apertures 120, and on or over surfaces (e.g., additional surfaces of the patterned mask structure 112) outside of the boundaries of the apertures 120. In additional embodiments, the masking material 121 is substantially confined with the boundaries (e.g., horizontal boundaries, vertical boundaries) of the apertures 120. The processing step depicted in FIG. 1H may permit subsequently formed contact structures to be provided in electrical connection with each of the tiers 110 of the stack structure 102 with fewer of the processing (e.g., photoresist structure 118 trimming and stack structure 102 etching) steps previously collectively described with respect to FIGS. 1E through 1G. In further embodiments, the processing step depicted in FIG. 1H is omitted, and the masking material 121 is omitted from each of the apertures 120.

The masking material 121, if any, may be selectively formed within one or more of the apertures 120 using conventional processes (e.g. conventional deposition processes, conventional photoexposure processes, conventional development processes) and conventional processing equipment, which are not described in detail herein. In addition, portions of the stack structure 102 underlying the apertures 120 remaining unfilled with the masking material 121 may be selectively removed using one or more additional conventional processes (e.g., one or more conventional anisotropic etching processes, such as one or more conventional anisotropic dry etching processes) and conventional processing equipment, which are also not described in detail herein.

Figure 1I:
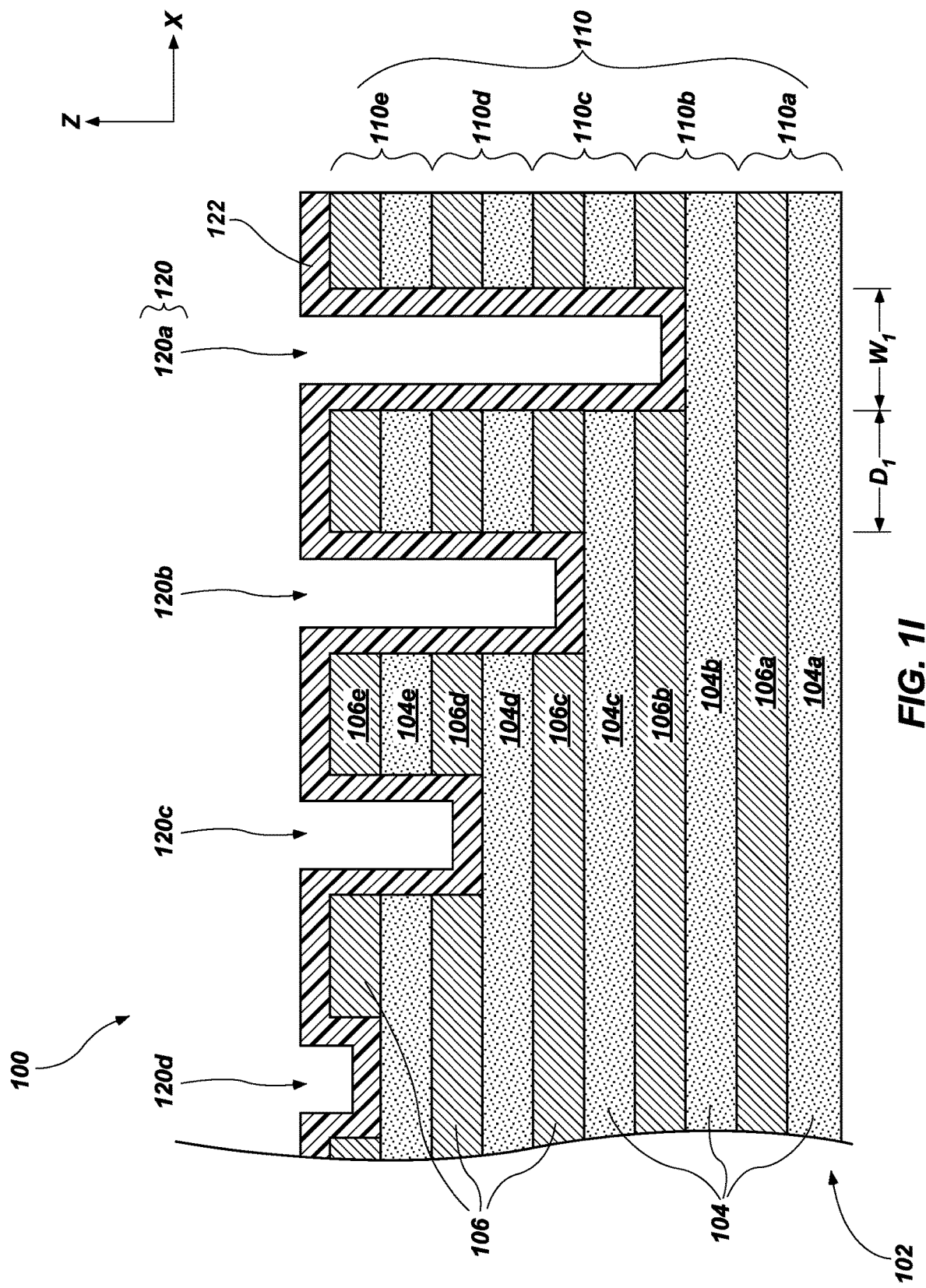

Referring next to FIG. 1I, the patterned mask structure 112 (FIG. 1G) and, if present, the masking material 121 (FIG. 1H) may be selectively removed, and a dielectric liner material 122 may be formed on or over exposed surfaces of the stack structure 102 (e.g., exposed surfaces of the insulative structures 104 and the additional insulative structures 106). As shown in FIG. 1I, the dielectric liner material 122 may extend continuously across the microelectronic device structure 100, and may partially (e.g., less than completely) fill the apertures 120 in the stack structure 102.

The patterned mask structure 112 (FIG. 1G) and the masking material 121 (FIG. 1H, if any) may be removed using conventional processes and conventional processing equipment, which are not described in detail herein. For example, the patterned mask structure 112 may be removed using at least one conventional chemical-mechanical planarization (CMP) process, and the masking material 121 (if any) may be removed using at least one conventional photoresist development process. In additional embodiments, the patterned mask structure 112 is not removed prior to forming the dielectric liner material 122. For example, the patterned mask structure 112 may be substantially maintained, such that the dielectric liner material 122 is formed on or over exposed surfaces of the patterned mask structure 112, and on or over exposed surfaces of the patterned mask structure 112. In such embodiments, the patterned mask structure 112 may be removed (e.g., using one or more conventional CMP processes) after the formation of the dielectric liner material 122, or may be at least partially (e.g., substantially) maintained in the microelectronic device structure 100 even after the completion of all other desired processing acts.

The dielectric liner material 122 may be formed of and include at least one dielectric material. A material composition of the dielectric liner material 122 may be selected such that the insulative structures 104 of the stack structure 102 are selectively etchable relative to the dielectric liner material 122. A material composition of the dielectric liner material 122 is different than a material composition of the insulative structures 104, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). The material composition of the dielectric liner material 122 may be substantially the same as the material composition of the additional insulative structures 106 of the stack structure 102, or the material composition of the dielectric liner material 122 may be different than the material composition of the additional insulative structures 106 of the stack structure 102. In some embodiments, the dielectric liner material 122 is formed of and includes a dielectric oxide material, such as $SiO_x$ (e.g., $SiO_2$). The dielectric liner material 122 may individually include a substantially homogeneous distribution of the at least one dielectric material, or a substantially heterogeneous distribution of the at least one dielectric material. In some embodiments, the dielectric liner material 122 exhibits a substantially homogeneous distribution of dielectric material. In additional embodiments, the dielectric liner material 122 exhibits a substantially heterogeneous distribution of dielectric material. The dielectric liner material 122 may, for example, be formed of and include a stack (e.g., laminate) of at least two different dielectric materials.

The dielectric liner material 122 may be formed to any suitable thickness. By way of non-limiting example, the thickness of the dielectric liner material 122 may be less than or equal to about 200 nm (e.g., less than or equal to about 100 nm, less than or equal to about 50 nm). In some embodiments, the thickness of the dielectric liner material 122 is less than or equal to about 100 nm. The thickness of the dielectric liner material 122 may be substantially uniform, or at least one region of the dielectric liner material 122 may have a different thickness than at least one other region of the dielectric liner material 122.

The dielectric liner material 122 may be formed using conventional processes (e.g., at least one conventional conformal deposition process, such as one or more of a conventional conformal CVD process and a conventional ALD process) and conventional processing equipment, which are not described in detail herein.

Referring next to FIG. 1J, portions of the dielectric liner material 122 (FIG. 1I) outside of boundaries (e.g., upper vertical boundaries, horizontal boundaries) of the apertures 120 (FIG. 1I) and at lower vertical boundaries (e.g., bottoms, floors, lower ends) of the apertures 120 may be removed to form dielectric liner structures 124 within the apertures 120, and then additional sacrificial structures 126 may be formed within portions of the apertures 120 remaining unfilled with (e.g., unoccupied by) the dielectric liner structures 124. Each additional sacrificial structure 126 may directly contact the insulative structure 104 defining the lower vertical boundary of the aperture 120 associated therewith, and a dielectric liner structure 124 may horizontally intervene between the additional sacrificial structure 126 and portions of the stack structure 102 defining the horizontal boundaries of the aperture 120 associated therewith. For example, as shown in FIG. 1J, a first additional sacrificial structure 126a may be formed on a portion of the second insulative structure 104b defining a lower vertical boundary of the first aperture 120a (FIG. 1I), a second additional sacrificial structure 126b may be formed on a portion of the third insulative structure 104c defining a lower vertical boundary of the second aperture 120b (FIG. 1I), a third additional sacrificial structure 126c may be formed on a portion of the fourth insulative structure 104d defining a lower vertical boundary of the third aperture 120c (FIG. 1I), and a fourth additional sacrificial structure 126d may be formed on a portion of the fifth insulative structure 104e defining a lower vertical boundary of the fourth aperture 120d (FIG. 1I).

The additional sacrificial structures 126 may be formed of and include at least one material that is selectively etchable relative to the materials of the dielectric liner structures 124 and the additional insulative structures 106 of the stack structure 102. Accordingly, the material composition of the additional sacrificial structures 126 is different than material compositions of the dielectric liner structures 124 and the additional insulative structures 106. In addition, the etch selectivity of the additional sacrificial structures 126 may be greater than or equal to the etch selectivity of the insulative structures 104 of the stack structure 102, such that the additional sacrificial structures 126 may be removed at a rate greater than or equal to a removal rate of the additional insulative structures 106 during treatment with a given etchant. By way of non-limiting example, depending on the material compositions of the insulative structures 104, the additional insulative structures 106, and the dielectric liner structures 124, the additional sacrificial structures 126 may comprise one or more of at least one dielectric oxide material (e.g., $AlO_x$), at least one carbon nitride material (e.g., $CN_y$), at least one dielectric oxynitride material (e.g., $SiO_xN_y$), at least one dielectric carboxynitride material (e.g., $SiO_xC_zN_y$), at least one dielectric nitride material (e.g., $SiN_y$). In some embodiments, the additional sacrificial structures 126 are formed of and include $AlO_x$. In additional embodiments, the additional sacrificial structures 126 are formed of and include $CN_y$.

The dielectric liner structures 124 and the additional sacrificial structures 126 may be formed through conventional processes (e.g., conventional material removal processes, conventional material deposition processes), which are not described in detail herein. By way of non-limiting example, the dielectric liner material 122 (FIG. 1I) may be anisotropically etched to selectively remove portions thereof outside of the apertures 120 (FIG. 1I) and at the lower vertical boundaries of the apertures 120 (FIG. 1I) to form the dielectric liner structures 124 and expose portions of the insulative structures 104 of different tiers 110 of the stack structure 102. Thereafter, at least one sacrificial material may be formed (e.g., through one or more conventional deposition processes, such as one or more of an ALD process, a CVD process, a PVD process, and a spin-coating process) inside and outside of the apertures 120. The sacrificial material may at least partially fill portions (e.g., volumes, open spaces) of the apertures 120 not occupied by the dielectric liner structures 124. Portions of the sacrificial material outside of the boundaries (e.g., horizontal boundaries, upper vertical boundaries) of the apertures 120 may then be removed (e.g., by way of at least one planarization process, such as at least one CMP process) to form the additional sacrificial structures 126.

Figure 1K:
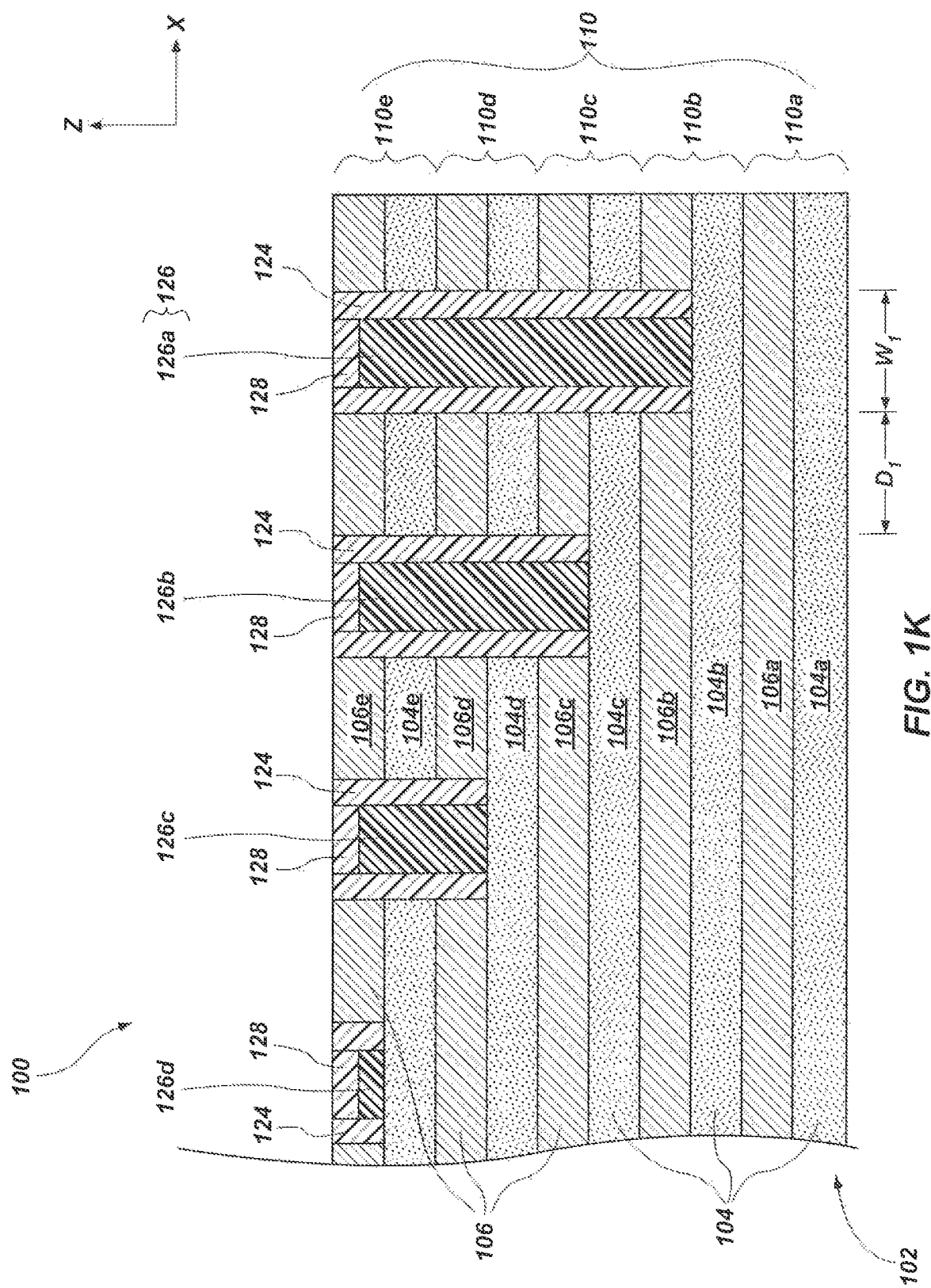

Referring next to FIG. 1K, the additional sacrificial structures 126 may be vertically recessed (e.g., upper vertical portions of the additional sacrificial structures 126 may be removed), and then capping structures 128 may be formed on remaining portions of the additional sacrificial structures

126. As shown in FIG. 1K, the capping structures 128 may be located horizontally adjacent the dielectric liner structures 124, and may be located vertically adjacent the remaining portions of the additional sacrificial structures 126. In addition, uppermost surfaces (e.g., in the Z-direction) of the capping structures 128 may be substantially coplanar with uppermost surfaces of the dielectric liner structures 124 and the stack structure 102 (e.g., uppermost surfaces of the fifth additional insulative structure 106*e* of the fifth tier 110*e* of the stack structure 102).

A material composition of the capping structures 128 may be selected such that the additional sacrificial structures 126 and the insulative structures 104 of the stack structure 102 are selectively etchable relative to the capping structures 128. Accordingly, the material composition of the capping structures 128 is different than material compositions of the additional sacrificial structures 126 and the insulative structures 104 of the stack structure 102. The etch selectivity of the capping structures 128 may substantially the same as the etch selectivities of the dielectric liner structures 124 and the additional insulative structures 106 of the stack structure 102 for a given etchant (e.g., an etchant subsequently employed to selectively remove the insulative structures 104 and the additional sacrificial structures 126), or the etch selectivity of the capping structures 128 may be different than the etch selectivities of the dielectric liner structures 124 and the additional insulative structures 106 for a given etchant. Thus, the material composition of the capping structures 128 may be the substantially the same as or may be different than the material compositions of the dielectric liner structures 124 and the additional insulative structures 106. By way of non-limiting example, depending on the material compositions of the insulative structures 104, the additional insulative structures 106, and the dielectric liner structures 124, the additional sacrificial structures 126 may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and at least one semiconductive material (e.g., polysilicon). In some embodiments, the capping structures 128 are formed of and include a dielectric oxide material, such as $SiO_x$ (e.g., $SiO_2$). In additional embodiments, the capping structures 128 are formed of and include a semiconductive material, such as polysilicon.

The additional sacrificial structures 126 may be vertically recessed and the capping structures 128 may be formed in the resulting recesses using conventional processes, which are not described in detail herein. By way of non-limiting example, the additional sacrificial structures 126 may be exposed to a wet etchant to remove upper portions thereof to form recesses at least partially defined by side surfaces of the dielectric liner structures 124. Thereafter, a capping material may be formed (e.g., through one or more conventional deposition processes, such as one or more of an ALD process, a CVD process, a PVD process, and a spin-coating process) on or over surfaces of the microelectronic device structure 100 inside and outside of the recesses. Portions of the capping material outside of the recesses may then be removed (e.g., by way of at least one planarization process, such as at least one CMP process) to form the capping structures 128.

Figure 1L:
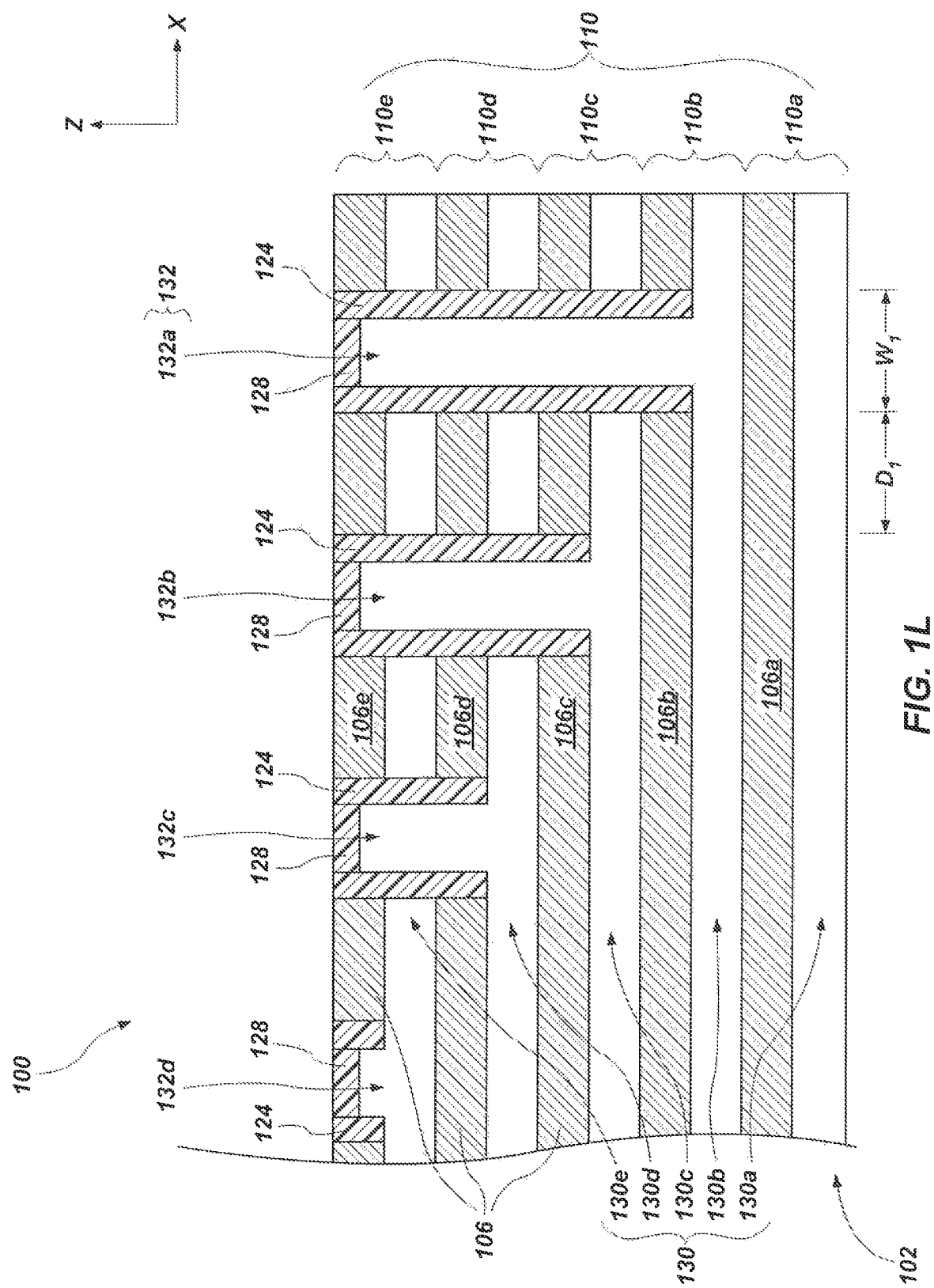

Referring next to FIG. 1L, the insulative structures 104 (FIG. 1K) of the stack structure 102 and the additional sacrificial structures 126 (FIG. 1K) may be selectively removed relative to the additional insulative structures 106 of the stack structure 102, the dielectric liner structures 124, and the capping structures 128. As shown in FIG. 1L, the material removal process may at least partially (e.g., substantially) replace the insulative structures 104 of the stack structure 102 with gate openings 130, and may substantially replace the additional sacrificial structures 126 with contact openings 132.

The gate openings 130 may have quantities, shapes, dimensions, and positions complementary to quantities, shapes, dimensions, and positions of the insulative structures 104 (FIG. 1K). As shown in FIG. 1L, the gate openings 130 may, for example, include a first gate opening 130*a* vertically underlying the first additional insulative structure 106*a*; a second gate opening 130*b* vertically between the first additional insulative structure 106*a* and the second additional insulative structure 106*b*; a third gate opening 130*c* vertically between the second additional insulative structure 106*b* and the third additional insulative structure 106*c*; a fourth gate opening 130*d* vertically between the third additional insulative structure 106*c* and the fourth additional insulative structure 106*d*; and a fifth gate opening 130*e* vertically between the fourth additional insulative structure 106*d* and the fifth additional insulative structure 106*e*. In additional embodiments, such as embodiments wherein the stack structure 102 includes a different quantity of tiers 110 (and, hence, a different number of insulative structures 104 (FIG. 1K)), a different quantity of the gate openings 130 is formed.

The contact openings 132 may have quantities, shapes, dimensions, and positions complementary to quantities, shapes, dimensions, and positions of the additional sacrificial structures 126 (FIG. 1K). As shown in FIG. 1L, the contact openings 132 may, for example, include a first contact opening 132*a* integral and continuous with the second gate opening 130*b*; a second contact opening 132*b* integral and continuous with the third gate opening 130*c*; a third contact opening 132*c* integral and continuous with the fourth gate opening 130*d*; and a fourth contact opening 132*d* integral and continuous with the fifth gate opening 130*e*. In additional embodiments, such as embodiments wherein the stack structure 102 includes a different quantity of tiers 110 (and, hence, a different quantity of additional sacrificial structures 126 (FIG. 1K)) and/or a different configuration of one or more of the additional sacrificial structures 126 (e.g., if, for example, a chopping process similar to that previously described with reference to FIG. 1H is performed), a different quantity of the contact openings 132 is formed and/or one or more of the contact openings 132 exhibits a different configuration than that depicted in FIG. 1L.

The gate openings 130 and the contact openings 132 may be formed by subjecting the microelectronic device structure 100 at the processing stage depicted in FIG. 1K to at least one etching process (e.g., an isotropic etching process) employing an etch chemistry in which the materials of the insulative structures 104 (FIG. 1K) and the additional sacrificial structures 126 (FIG. 1K) are selectively removed relative to the additional insulative structures 106, the dielectric liner structures 124, and the capping structures 128. For example, slots (e.g., slits, trenches) may be formed to vertically extend through (e.g., completely through) the stack structure 102 to form discrete blocks. Thereafter, portions of the insulative structures 104 and the additional sacrificial structures 126 may be selectively removed (e.g., selectively etched and exhumed) through the slots using the aforementioned etch chemistry. The material of the insulative structures 104 may be removed through the slots to form the gate openings 130, and the material of the additional sacrificial structures 126 may be removed through the gate openings 130 and the slots to form the contact openings 132. As a non-limiting example, if the insulative structures 104 and the additional sacrificial structures 126 are formed of and include one or more dielectric nitride materials (e.g., $SiN_y$), the microelectronic device structure 100 may be treated with a wet etchant comprising phosphoric acid ($H_3O_4P$) to selectively remove the insulative structures 104 and the additional sacrificial structures 126 relative to the additional insulative structures 106, the dielectric liner structures 124, and the capping structures 128 and form the gate openings 130 and the contact openings 132.

Figure 1M:
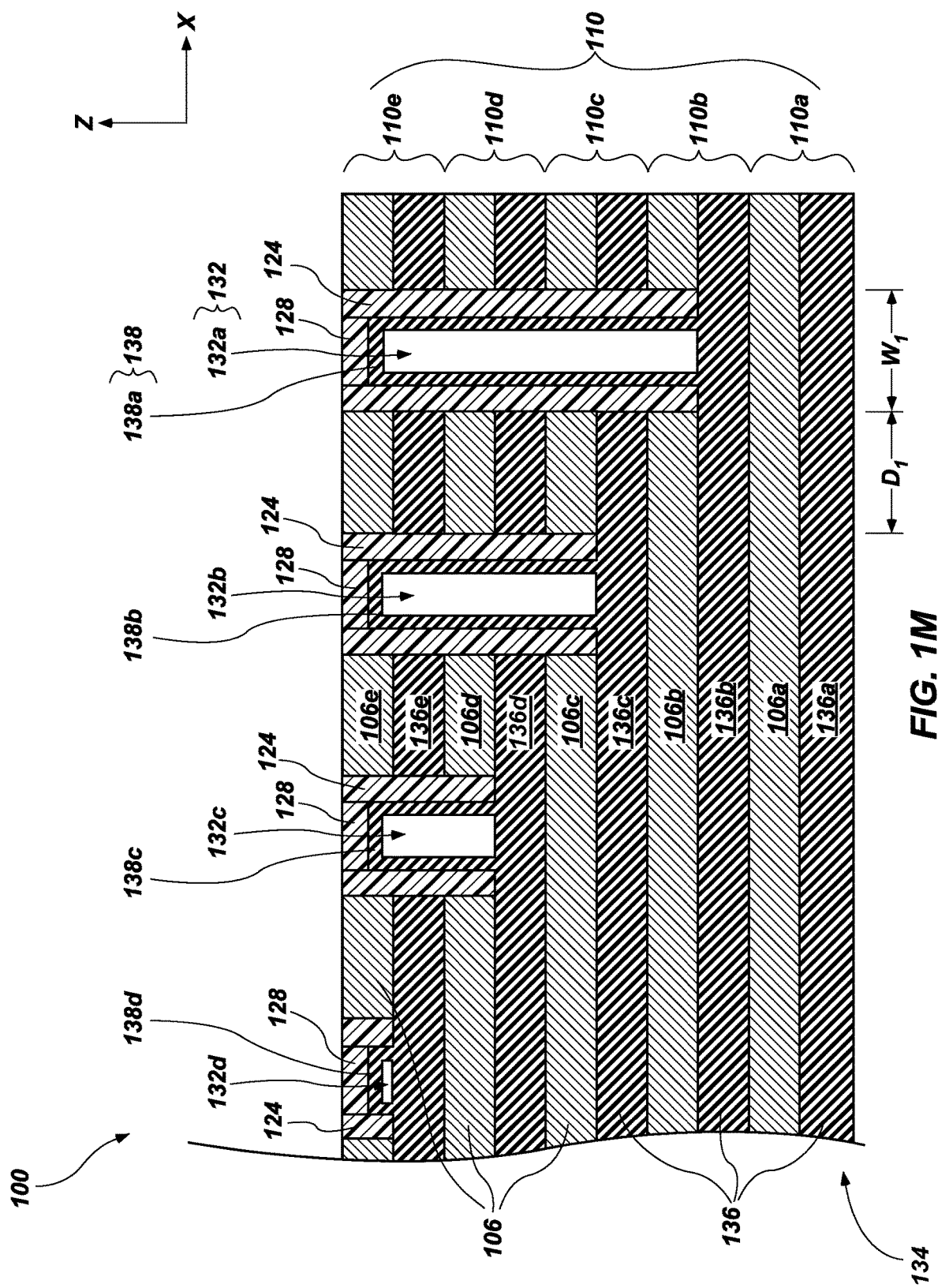

Referring next to FIG. 1M, gate structures 136 are formed within the gate openings 130 (FIG. 1L), and preliminary contact structures 138 are formed within the contact openings 132. As shown in FIG. 1M, the gate structures 136 may substantially fill the gate openings 130 (FIG. 1L), and the preliminary contact structures 138 may partially fill the contact openings 132.

The gate structures 136 may have quantities, shapes, dimensions, and positions complementary to quantities, shapes, dimensions, and positions of the gate openings 130 (FIG. 1L). As shown in FIG. 1M, the gate structures 136 may, for example, include a first gate structure 136a vertically underlying the first additional insulative structure 106a; a second gate structure 136b vertically between the first additional insulative structure 106a and the second additional insulative structure 106b; a third gate structure 136c vertically between the second additional insulative structure 106b and the third additional insulative structure 106c; a fourth gate structure 136d vertically between the third additional insulative structure 106c and the fourth additional insulative structure 106d; and a fifth gate structure 136e vertically between the fourth additional insulative structure 106d and the fifth additional insulative structure 106e. In additional embodiments, such as embodiments wherein the stack structure 102 (FIG. 1K) is formed to include a different quantity of tiers 110, a different quantity of the gate structures 136 is formed. The gate structures 136 and the additional insulative structures 106 may form a modified stack structure 134 including a vertically alternating sequence of the gate structures 136 and the additional insulative structures 106 arranged in the tiers 110.

The preliminary contact structures 138 may have quantities, shapes, dimensions, and positions complementary to quantities, shapes, dimensions, and positions of the contact openings 132. The preliminary contact structures 138 may each individually only partially (e.g., less than completely) fill the contact opening 132 associated therewith. For example, the preliminary contact structures 138 may line surfaces of the dielectric liner structures 124 and the capping structure 128 partially defining the contact openings 132, but central portions of the contact openings 132 may remain free of the material of the preliminary contact structures 138. As shown in FIG. 1M, the preliminary contact structures 138 may, for example, include a first preliminary contact structure 138a integral and continuous with the second gate structure 136b; a second preliminary contact structure 138b integral and continuous with the third gate structure 136c; a third preliminary contact structure 138c integral and continuous with the fourth gate structure 136d; and a fourth preliminary contact structure 138d integral and continuous with the fifth gate structure 136e. The first preliminary contact structure 138a and the second gate structure 136b may comprise different portions of a first monolithic structure; the second preliminary contact structure 138b and the third gate structure 136c may comprise different portions of a second monolithic structure; the third preliminary contact structure 138c and the fourth gate structure 136d may comprise different portions of a third monolithic structure; and the fourth preliminary contact structure 138d and the fifth gate structure 136e may comprise different portions of a fourth monolithic structure. As used herein, the term "monolithic structure" means and includes a structure formed as, and comprising a single (e.g., only one), unitary structure of material. In additional embodiments, such as embodiments wherein the stack structure 102 (FIG. 1K) includes a different quantity of tiers 110 and/or a different configuration of one or more of the contact openings 132, a different quantity of the preliminary contact structures 138 is formed and/or one or more of the preliminary contact structures 138 exhibits a different configuration than that depicted in FIG. 1M.

The gate structures 136 and the preliminary contact structures 138 may be formed of and include at least one electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), and a conductive metal-containing material (e.g., a conductive metal nitride, a conductive metal silicide, a conductive metal carbide, a conductive metal oxide). In some embodiments, the gate structures 136 and the preliminary contact structures 138 are formed of and include W.

The gate structures 136 and the preliminary contact structures 138 may be formed by infiltrating the gate openings 130 (FIG. 1L) and the contact openings 132 (FIG. 1L) with electrically conductive material through the slots previously formed to within the stack structure 102 (FIG. 1L) to form the gate openings 130 (FIG. 1L) and the contact openings 132 (FIG. 1L). Since the contact openings 132 may exhibit relatively greater volumes than the gate openings 130, the contact openings 132 may only be partially filled with the electrically conductive material during the infiltration process, whereas the gate openings 130 may be substantially filled during the infiltration process. The infiltration process may employ conventional material deposition processes and process parameters, such as those conventionally employed for so called "replacement gate" or "gate last" processing.

Figure 1N:
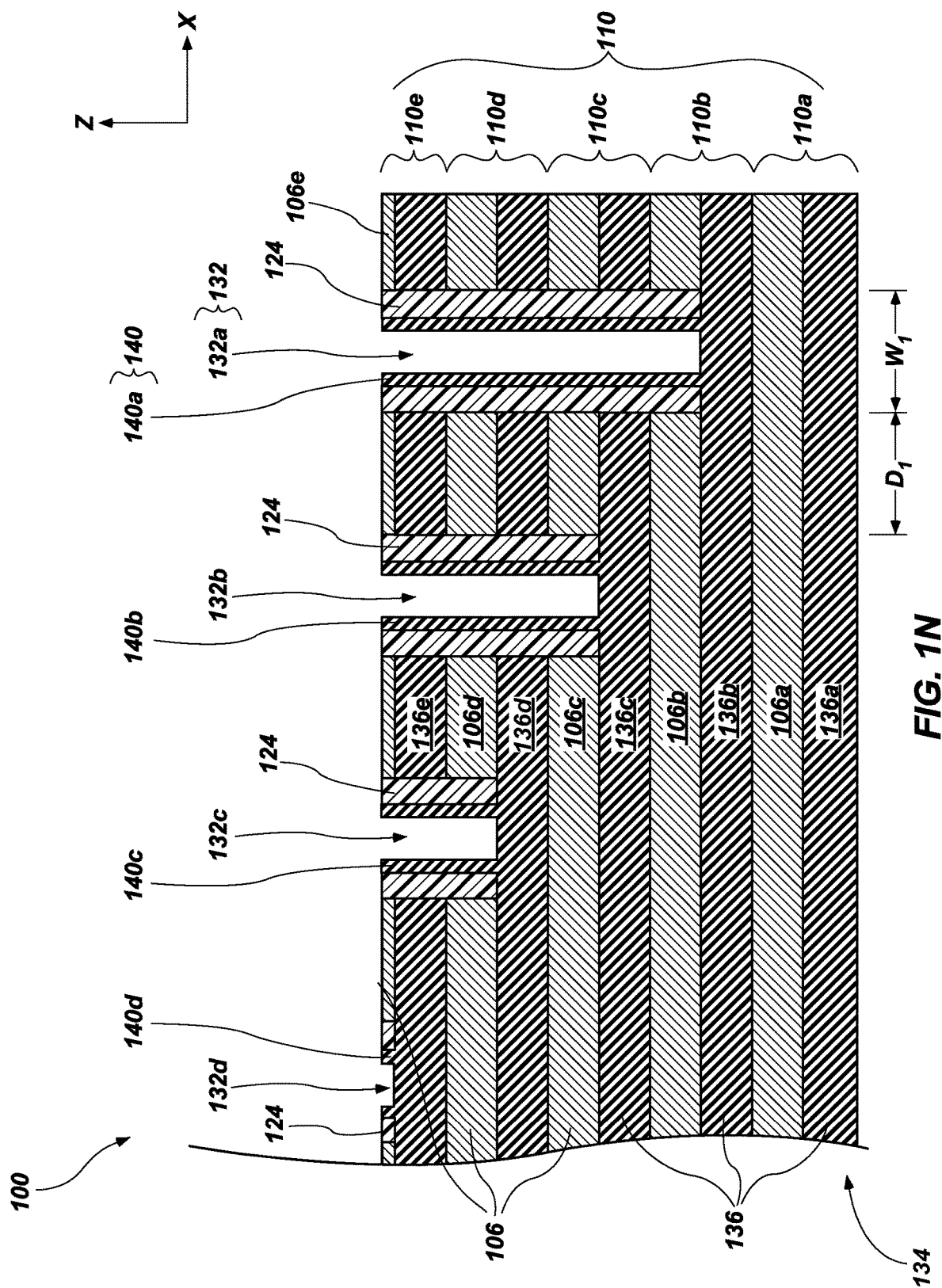
Figure 10:
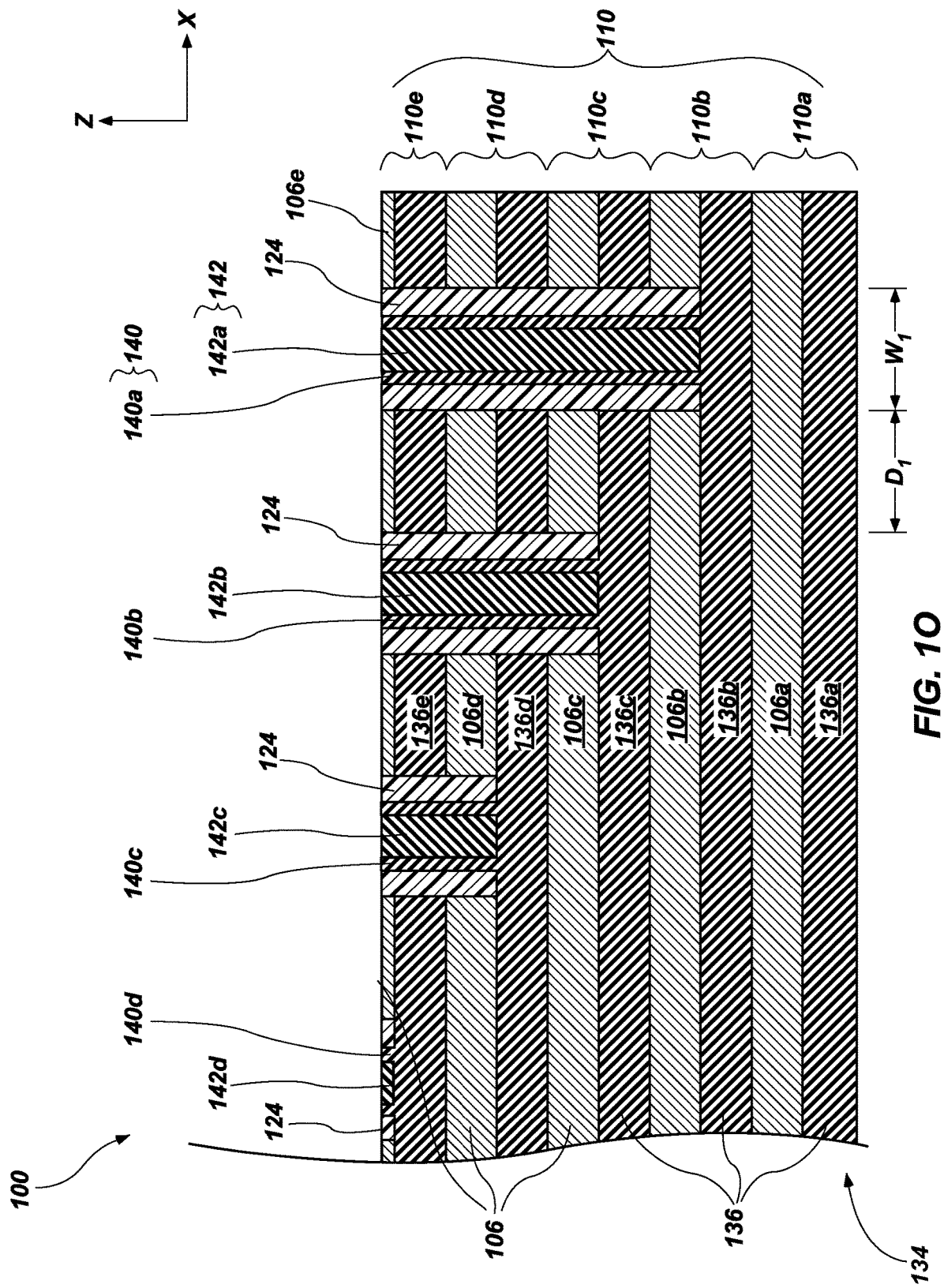

Referring next to FIG. 1N, the capping structures 128 (FIG. 1M) and upper portions of the preliminary contact structures 138 and the modified stack structure 134 (e.g., upper portions of the fifth additional insulative structure 106e of the fifth tier 110e of the modified stack structure 134) may be selectively removed. As shown in FIG. 1N, the selective removal of the capping structures 128 (FIG. 1M) and the upper portions of the preliminary contact structures 138 and the modified stack structure 134 may open (e.g., uncover, expose) the remaining portions of the contact openings 132, and may form contact structures 140 from the preliminary contact structures 138.

The contact structures 140 may line surfaces of the dielectric liner structures 124 partially defining the contact openings 132. In some embodiments, the contact structures 140 exhibit generally tubular shapes including generally annular horizontal cross-sectional shapes. As shown in FIG. 1N, the contact structures 140 may, for example, include a first contact structure 140a integral and continuous with the second gate structure 136b; a second contact structure 140b integral and continuous with the third gate structure 136c; a third contact structure 140c integral and continuous with the fourth gate structure 136d; and a fourth contact structure 140d integral and continuous with the fifth gate structure 136e. The first contact structure 140a and the second gate structure 136b may comprise different portions of a first monolithic structure; the second contact structure 140b and the third gate structure 136c may comprise different portions of a second monolithic structure; the third preliminary contact structure 138c and the fourth gate structure 136d may comprise different portions of a third monolithic structure; and the fourth preliminary contact structure 138d and the fifth gate structure 136e may comprise different portions of a fourth monolithic structure. In additional embodiments, such as embodiments wherein the stack structure 102 (FIG. 1K) includes a different quantity of tiers 110 and/or a different configuration of one or more of the contact openings 132, a different quantity of the contact structures 140 is formed and/or one or more of the contact structures 140 exhibits a different configuration than that depicted in FIG. 1N.

The capping structures 128 (FIG. 1M) and the upper portions of the preliminary contact structures 138 and the modified stack structure 134 (e.g., upper portions of the fifth additional insulative structure 106e of the fifth tier 110e of the modified stack structure 134) may be removed using conventional processes and conventional processing equipment, which are not described in detail herein. For example, the capping structures 128 (FIG. 1M) and the upper portions of the modified stack structure 134 may be removed using a conventional planarization process (e.g., a conventional CMP process) to expose upper surfaces of the preliminary contact structures 138, and then portions of the preliminary contact structures 138 vertically overlying and horizontally aligned with the remaining portions of the contact openings 132 may be removed (commonly referred to as "punched through") to form the contact structures 140 and expose the remaining portions of the contact openings 132.

Referring next to FIG. 1O, fill structures 142 may be formed within the remaining portions of the contact openings 132 (FIG. 1N). As shown in FIG. 1O, the fill structures 142 may substantially fill the remaining portions of the contact openings 132 (FIG. 1N).

The fill structures 142 may have quantities, shapes, dimensions, and positions complementary to quantities, shapes, dimensions, and positions of the remaining portions of the contact openings 132 (FIG. 1N). The fill structures 142 may be substantially confined with boundaries (e.g., horizontal boundaries, vertical boundaries) of the remaining portions of the contact openings 132. For example, each of the fill structures 142 may individually vertically extend to and physically contact one of the gate structures 136 of the modified stack structure 134, and may also be substantially horizontally surrounded by one of the contact structures 140. As shown in FIG. 1O, the fill structures 142 may, for example, include a first fill structure 142a on the second gate structure 136b and substantially horizontally surrounded by first contact structure 140a; a second fill structure 142b on the third gate structure 136c and substantially horizontally surrounded by second contact structure 140b; a third fill structure 142c on the fourth gate structure 136d and substantially horizontally surrounded by third contact structure 140c; and a fourth fill structure 142d on the fifth gate structure 136e and substantially horizontally surrounded by fourth contact structure 140d. In additional embodiments, such as embodiments wherein the stack structure 102 (FIG. 1K) includes a different quantity of tiers 110 and/or a different configuration of one or more of the contact openings 132, a different quantity of the fill structures 142 is formed and/or one or more of the fill structures 142 exhibits a different configuration than that depicted in FIG. 1O. In further embodiments, the fill structures 142 are omitted (e.g., are not formed).

The fill structures 142 may be formed of and include one or more of at least one electrically conductive material, at least one electrically insulative material, and at least one semiconductive material. In some embodiments, the fill structures 142 are formed of and include at least one electrically conductive material. By way of non-limiting example, the fill structures 142 may be formed of and include one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the fill structures 142 are formed of and include at least one metal (e.g., W).

The fill structures 142 may be formed through conventional processes (e.g., conventional material deposition processes, conventional material removal processes), which are not described in detail herein. By way of non-limiting example, a fill material may be formed (e.g., through one or more conventional deposition processes, such as one or more of an ALD process, a CVD process, a PVD process, and a spin-coating process) inside and outside of the remaining portions of the contact openings 132 (FIG. 1N). The fill material may substantially fill portions (e.g., volumes, open spaces) of the contact openings 132 not occupied by the contact structures 140. Portions of the fill material outside of the boundaries (e.g., horizontal boundaries, upper vertical boundaries) of the remaining portions of the contact openings 132 may then be removed (e.g., by way of at least one planarization process, such as a CMP process) to form the fill structures 142.

Thus, in accordance with embodiments of the disclosure, a method of forming a microelectronic device comprises forming a stack structure comprising insulative structures and additional insulative structures vertically alternating with the insulative structures. Apertures are formed to extend to surfaces of the insulative structures at different depths than one another within the stack structure. Dielectric liner structures are formed within the apertures. Sacrificial structures are formed within portions of the apertures remaining unoccupied by the dielectric liner structures. Upper portions of the sacrificial structures are replaced with capping structures. Portions of the insulative structures and remaining portions of the sacrificial structures are replaced with electrically conductive material.

Figure 2:
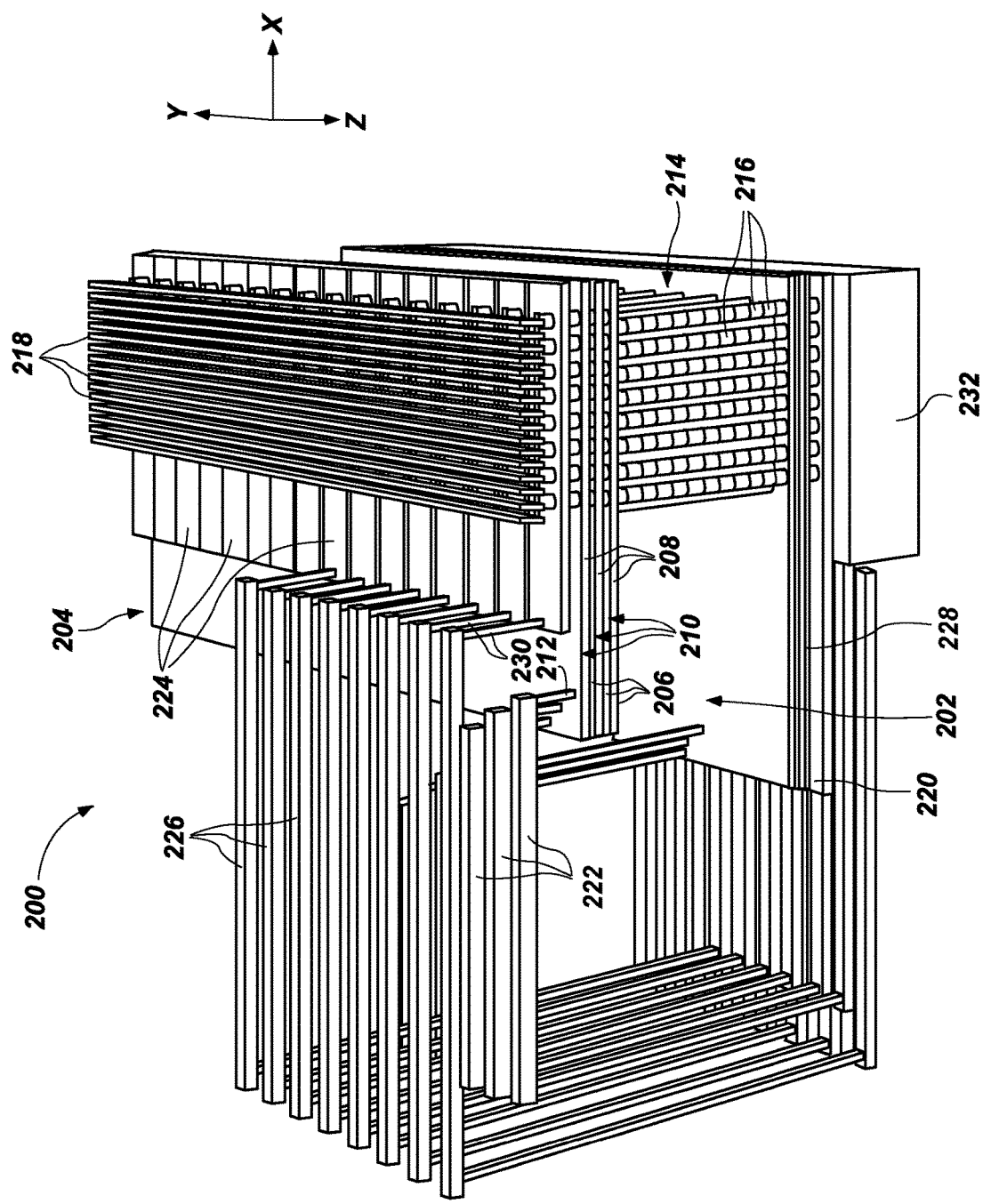
FIG. 2 is a partial cutaway perspective view of a microelectronic device, in accordance with embodiments of the disclosure.

FIG. 2 illustrates a partial cutaway perspective view of a portion of a microelectronic device 200 (e.g., a memory device, such as a 3D NAND Flash memory device) including a microelectronic device structure 202. The microelectronic device structure 202 may be substantially similar to and may be formed in substantially the same manner as the microelectronic device structure 100 at the processing stage previously described with reference to FIG. 1O. For example, as shown in FIG. 2, the microelectronic device structure 202 may include a stack structure 204 a vertically alternating (e.g., in the Z-direction) sequence of conductive structures 206 and insulative structures 208 arranged in tiers 210, and contact structures 212 vertically extending (e.g., in the Z-direction) from the conductive structures 206. Each of the contact structures 212 is individually integral and continuous with (e.g., forms a monolithic structure with) one of the conductive structures 206 of the tiers 210 of the stack structure 204. The stack structure 204, the conductive structures 206, the insulative structures 208, the tiers 210, and the contact structures 212 may respectively be substantially similar to the modified stack structure 134, the gate structures 136, the additional insulative structures 106, and the contact structures 140 previously described with reference to FIGS. 1N and 1O. The microelectronic device structure 202 may further include dielectric liner structures and, optionally, fill structures respectively substantially similar to the dielectric liner structures 124 and the fill structures 142 previously described with reference to FIGS. 1N and 1O. The microelectronic device 200 also includes additional features (e.g., structures, devices) operatively associated with the microelectronic device structure 202, as described in further detail below.

The microelectronic device 200 may further include vertical strings 214 of memory cells 216 coupled to each other in series, data lines 218 (e.g., bit lines), a source structure 220, access lines 222, first select gates 224 (e.g., upper select gates, drain select gates (SGDs)), select lines 226, second select gates 228 (e.g., lower select gates, source select gate (SGSs)), and additional contact structures 230. The vertical strings 214 of memory cells 216 extend vertically and orthogonal to conductive lines and tiers (e.g., the data lines 218, the source structure 220, the tiers 210 of the stack structure 204, the access lines 222, the first select gates 224, the select lines 226, the second select gates 228). The contact structures 212 and the additional contact structures 230 may electrically couple components to each other as shown (e.g., the select lines 226 to the first select gates 224, the access lines 222 to the tiers 210 of the stack structure 204 of the microelectronic device structure 202).

With continued reference to FIG. 2, the microelectronic device 200 may also include a control unit 232 (e.g., a control device) positioned vertically below the strings 214 of memory cells 216, which may include one or more of string driver circuitry, pass gates, circuitry for selecting gates, circuitry for selecting conductive lines (e.g., the access lines 222, the select lines 226, the data lines 218, additional access lines, additional select lines, additional data lines), circuitry for amplifying signals, and circuitry for sensing signals. In some embodiments, the control unit 232 is at least partially (e.g., substantially) positioned within horizontal boundaries (e.g., in the X-direction and the Y-direction) of a horizontal area occupied by the strings 214 of memory cells 216. The control unit 232 may, for example, be electrically coupled to the data lines 218, the source structure 220, the access lines 222, and select lines 226. In some embodiments, the control unit 232 includes CMOS (complementary metal-oxide-semiconductor) circuitry. In such embodiments, the control unit 232 may be characterized as having a "CMOS under Array" ("CuA") configuration.

Thus, in accordance with embodiments of the disclosure, a microelectronic device comprises a stack structure and conductive contact structures. The stack structure comprises a vertically alternating sequence of conductive structures and insulating structures. The stack structure is free of staircase structures at horizontal ends thereof. The conductive contact structures vertically extend to upper vertical boundaries of the conductive structures at different depths than one another within the stack structure. The conductive contact structures are each individually integral and continuous with one of the conductive structures.

Figure 3:
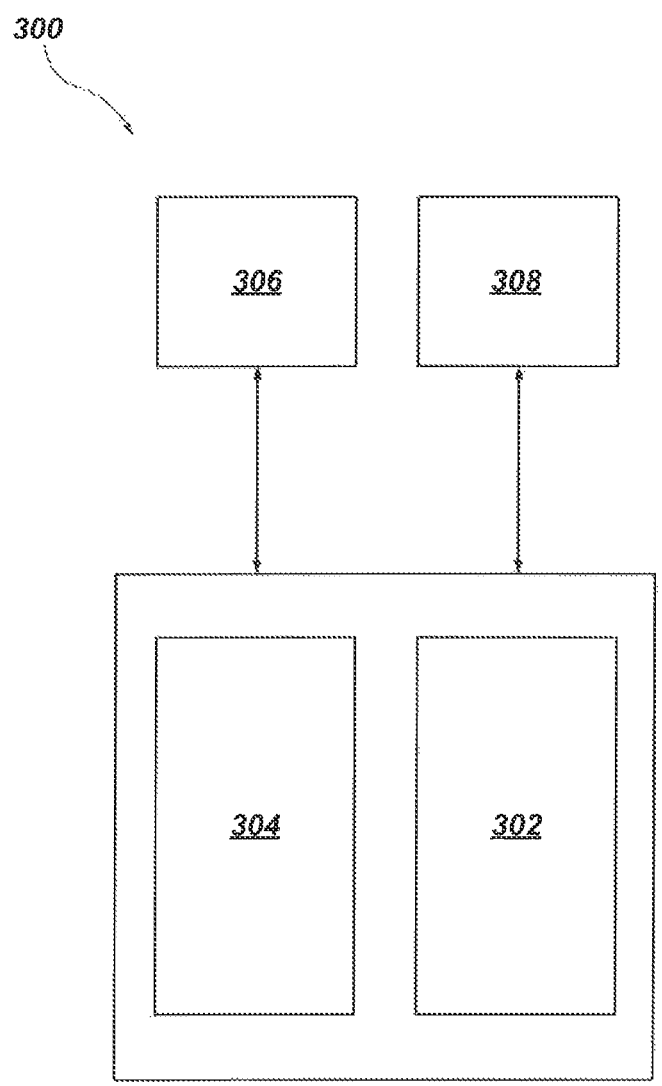
FIG. 3 is a schematic block diagram illustrating an electronic system, in accordance with embodiments of the disclosure.

Microelectronic device structures (e.g., the microelectronic device structures 100, 202 previously described with reference to FIGS. 1O and 2) and microelectronic devices (e.g., the microelectronic device 200 previously described with reference to FIG. 2) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a microelectronic device structure and a microelectronic device previously described herein. The electronic system 300 may further include at least one electronic signal processor device 304 (often referred to as a "microprocessor"). The electronic signal processor device 304 may, optionally, include an embodiment of one or more of a microelectronic device structure and a microelectronic device previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure and a microelectronic device previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, one or more of a monitor, a display, a printer, an audio output jack, and a speaker. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises a microelectronic device structure, conductive line structures, and a control device. The microelectronic device structure comprises a stack structure and conductive contact structures within filled apertures in the stack structure. The stack structure comprises tiers each comprising a conductive structure and an insulative structure vertically neighboring the conductive structure. The stack structure is free of staircase structures located at horizontal ends of the tiers. The conductive contact structures are each individually integral and continuous with the conductive structure of one of the tiers of the stack structure. The conductive line structures are electrically connected to the conductive contact structures of the microelectronic device structure. The control device is electrically connected to the conductive line structures.

The methods, structures (e.g., the microelectronic device structures 100, 202), devices (e.g., the microelectronic device 200), and systems (e.g., the electronic system 300) of the disclosure advantageously facilitate one or more of improved performance, reliability, and durability, lower costs, increased miniaturization of components, improved pattern quality, and greater packaging density as compared to conventional structures, conventional devices, and conventional systems. The methods and structures of the disclosure may substantially alleviate problems related to the formation and processing of conventional microelectronic devices including stack structures having staircase structures at edges thereof. For example, the methods and structures of the disclosure do not suffer from the relatively small sizing and spacing error margins associated with properly forming staircase structures of conventional microelectronic device structures to receive contact structures thereon. In addition, the methods and structures of the disclosure may reduce the risk of undesirable damage (e.g., contact punch through) as well as undesirable current leakage and short circuits as compared to conventional methods and conventional structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A method of forming a microelectronic device, comprising:
    forming a stack structure comprising insulative structures and additional insulative structures vertically alternating with the insulative structures;
    forming apertures extending to surfaces of the insulative structures at different depths than one another within the stack structure;
    forming dielectric liner structures within the apertures;
    forming sacrificial structures within portions of the apertures remaining unoccupied by the dielectric liner structures;
    replacing upper portions of the sacrificial structures with capping structures; and
    replacing portions of the insulative structures and remaining portions of the sacrificial structures with electrically conductive material.

2. The method of claim 1, wherein replacing the sacrificial structures and the insulative structures with electrically conductive material comprises:
    forming slots vertically extending through the stack structure;
    exhuming the portions the insulative structures through the slots to form first openings;
    exhuming the remaining portions of the sacrificial structures through the first openings and the slots to form second openings continuous with the first openings;
    partially filling the second openings with the electrically conductive material to form contact structures; and
    substantially filling the first openings with the electrically conductive material to form conductive structures integral and continuous with the contact structures.

3. The method of claim 2, wherein partially filling the second openings with the electrically conductive material to form conductive contact structures comprises lining inner side surfaces of the dielectric liner structures and bottom surfaces of the capping structures with the electrically conductive material.

4. The method of claim 2, further comprising:
    removing the capping structures and upper portions of the contact structures to expose portions of the second openings unoccupied by the contact structures; and
    forming additional conductive structures within the portions of the second openings and in physical contact with the conductive structures.

5. The method of claim 4, wherein removing the capping structures and upper portions of the contact structures comprising forming remaining portions of the contact structures to have generally tubular shapes.

6. The method of claim 4, wherein forming additional conductive structures comprises forming upper surfaces of the additional conductive structures to be substantially coplanar with upper surfaces of remaining portions of the stack structure, the dielectric liner structures, and the contact structures.

7. The method of claim 1, further comprising:
    forming the insulative structures to comprise dielectric nitride material;
    forming the additional insulative structures to comprise dielectric oxide material;
    forming dielectric liner structures to comprise additional dielectric oxide material;
    forming the sacrificial structures to comprise one or more of aluminum oxide material and carbon nitride material; and
    forming the capping structures to comprise further dielectric oxide material.

8. The method of claim 1, wherein forming apertures extending to surfaces of the insulative structures at different depths than one another within the stack structure comprises:
    forming a patterned mask structure over the stack structure;
    forming additional sacrificial structures within openings in the patterned mask structure;
    forming a photoresist structure over the additional sacrificial structures and the patterned mask structure; and
    subjecting the photoresist structure, the additional sacrificial structures, and the stack structure to a series of material removal processes to selectively remove portions of the photoresist structure, portions of the additional sacrificial structures not covered by remaining portions of the photoresist structure, and portions of the stack structure not covered by one or more of the patterned mask structure and the remaining portions of the photoresist structure to form the apertures.

9. The method of claim 8, wherein forming a patterned mask structure over the stack structure comprises forming the patterned mask structure to comprise one or more of amorphous carbon and boron-doped amorphous carbon.

10. The method of claim 9, wherein forming additional sacrificial structures within openings in the patterned mask structure comprises forming the additional sacrificial structures to comprise one or more of polysilicon and a dielectric oxide material.

11. The method of claim 1, further comprising:
forming a masking material within one or more of the apertures prior to forming the dielectric liner structures within the apertures; and
increasing depths of one or more other of the apertures after forming the masking material within the one or more of the apertures.

12. The method of claim 1, wherein forming dielectric liner structures within the apertures comprises:
conformally forming dielectric liner material on exposed surfaces of the stack structure inside and outside the apertures; and
removing portions of the dielectric liner material outside of the apertures and lower vertical boundaries of the apertures while substantially maintaining other portions of the dielectric liner material at horizontal boundaries of the apertures.

13. The method of claim 1, wherein replacing upper portions of the sacrificial structures with capping structures comprises:
vertically recessing the sacrificial structures to form openings;
forming a capping material on exposed surfaces of the stack structure and the sacrificial structures inside and outside of the openings; and
removing portions of the capping material outside boundaries of the openings to form the capping structures.

14. The method of claim 13, wherein removing portions of the capping material outside boundaries of the openings comprises subjecting the capping material to at least one chemical-mechanical planarization process.

15. A microelectronic device, comprising:
a stack structure comprising vertically alternating conductive structures and insulating structures arranged in tiers each comprising one of the conductive structures and one of the insulating structures, the stack structure free of staircases having steps defined by edges of the tiers;
conductive contact structures vertically extending to two or more of the conductive structures located at different depths than one another within the stack structure, the conductive contact structures each individually integral with one of the two or more of the conductive structures;
a source structure vertically underlying the stack structure;
data lines vertically overlying the stack structure;
an array of vertically extending strings of memory cells extending through the stack structure and electrically connected to the source structure and the data lines;
access lines electrically connected to the conductive contact structures; and
a control device vertically underlying the source structure and within horizontal boundaries of the array of vertically extending strings of memory cells, the control device electrically connected to the source structure, the data lines, and the access lines.

16. The microelectronic device of claim 15, further comprising dielectric liner structures horizontally intervening between the conductive contact structures and the stack structure.

17. The microelectronic device of claim 16, further comprising additional conductive structures substantially horizontally surrounded by the conductive contact structures and in physical contact with the conductive structures of the stack structure.

18. The microelectronic device of claim 15, wherein the conductive contact structures each have an annular horizontal cross-sectional shape.

19. An electronic system, comprising:
an input device;
an output device;
a processor device operably coupled to the input device and the output device; and
a memory device operably coupled to the processor device and comprising:
a microelectronic device structure comprising:
a stack structure comprising tiers each comprising a conductive structure and an insulative structure vertically neighboring the conductive structure, the stack structure free of staircases having steps defined by edges of the tiers; and
conductive contact structures within filled apertures in the stack structure and each individually integral and continuous with the conductive structure of one of the tiers of the stack structure;
conductive line structures electrically connected to the conductive contact structures of the microelectronic device structure; and
a control device electrically connected to the conductive line structures.

* * * * *

UNITED STATES PATENT AND TRADEMARK OFFICE
CERTIFICATE OF CORRECTION

PATENT NO. : 11,049,768 B2  Page 1 of 1
APPLICATION NO. : 16/667733
DATED : June 29, 2021
INVENTOR(S) : Hopkins et al.

It is certified that error appears in the above-identified patent and that said Letters Patent is hereby corrected as shown below:

In the Specification

| | | |
|---|---|---|
| Column 6, | Line 39, | change "Sift" to --$SiO_2$-- |
| Column 8, | Line 35, | change "Wi" to --$W_1$-- |
| Column 8, | Line 38, | change "Di" to --$D_1$-- |
| Column 8, | Line 40, | change "Wi" to --$W_1$-- |
| Column 8, | Line 43, | change "Wi" to --$W_1$-- |
| Column 8, | Line 44, | change "Di" to --$D_1$-- |
| Column 8, | Line 50, | change "Di" to --$D_1$-- |
| Column 8, | Line 64, | change "Wi" to --$W_1$-- |
| Column 8, | Line 66, | change "Di" to --$D_1$-- |
| Column 9, | Line 2, | change "Di" to --$D_1$-- |
| Column 10, | Line 1, | change "Sift" to --$SiO_2$-- |
| Column 10, | Line 3, | change "Sift" to --$SiO_2$-- |

In the Claims
| | | | |
|---|---|---|---|
| Claim 2, | Column 28, | Line 3, | change "portions the" to --portions of the-- |
| Claim 19, | Column 30, | Line 42-43, | change "integral and continuous with" to --integral with-- |

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*